(12) United States Patent
Kim et al.

(10) Patent No.: US 11,159,034 B2
(45) Date of Patent: Oct. 26, 2021

(54) WIRELESS CHARGING STAND, AND METHOD FOR OPERATING ELECTRONIC DEVICE LINKED THERETO

(71) Applicant: Samsung Electronics Co., Ltd., Suwon-si (KR)

(72) Inventors: Han Kim, Namyangju-si (KR); Namhyun Kang, Seoul (KR); Hankyung Ji, Goyang-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 103 days.

(21) Appl. No.: 16/490,475

(22) PCT Filed: Feb. 28, 2018

(86) PCT No.: PCT/KR2018/002455
§ 371 (c)(1),
(2) Date: Aug. 30, 2019

(87) PCT Pub. No.: WO2018/159998
PCT Pub. Date: Sep. 7, 2018

(65) Prior Publication Data
US 2020/0259344 A1 Aug. 13, 2020

(30) Foreign Application Priority Data
Mar. 2, 2017 (KR) .................. 10-2017-0027021

(51) Int. Cl.
*H02J 7/00* (2006.01)
*H02J 50/90* (2016.01)
(Continued)

(52) U.S. Cl.
CPC ............ *H02J 7/0044* (2013.01); *G01C 19/34* (2013.01); *G01R 33/07* (2013.01); *H02J 50/10* (2016.02);
(Continued)

(58) Field of Classification Search
CPC .......... H02J 7/0044; H02J 50/90; H02J 50/10; H02J 7/025; H02J 7/0042; G01C 19/34;
(Continued)

(56) References Cited

U.S. PATENT DOCUMENTS

2010/0081473 A1* 4/2010 Chatterjee ............... H02J 50/10
455/559
2014/0035517 A1* 2/2014 Dunko ..................... H02J 5/005
320/108
(Continued)

FOREIGN PATENT DOCUMENTS

JP 2010187171 A 8/2010
KR 10-2009-0113418 A 11/2009
(Continued)

OTHER PUBLICATIONS

Supplementary European Search Report dated Jan. 15, 2020 in connection with European Patent Application No. 18 76 1693, 7 pages.
(Continued)

*Primary Examiner* — Edward Tso
*Assistant Examiner* — Ahmed H Omar

(57) ABSTRACT

Provided according to various embodiments can be a stand comprising: a stand housing; a wireless power transmission member disposed in the internal space of the stand housing; and at least one magnet disposed near the wireless power transmission member, wherein the stand is coupled to the outer surface of an electronic device in such a manner that at least one attachment member disposed in a corresponding position in the internal space of the electronic device is attached thereto by the magnetic force of the magnet, and supplies wireless power to the electronic device via the wireless power transmission member. Other various embodiments are possible.

18 Claims, 16 Drawing Sheets

(51) Int. Cl.
  *H02J 50/10*   (2016.01)
  *G01C 19/34*   (2006.01)
  *G01R 33/07*   (2006.01)
  *H04M 1/02*    (2006.01)
  *H04M 1/04*    (2006.01)

(52) U.S. Cl.
  CPC ............ *H02J 50/90* (2016.02); *H04M 1/0202* (2013.01); *H04M 1/04* (2013.01)

(58) Field of Classification Search
  CPC ...... G01R 33/07; H04M 1/0202; H04M 1/04; H04M 1/02
  USPC ......................................................... 320/108
  See application file for complete search history.

(56) References Cited

U.S. PATENT DOCUMENTS

| | | | |
|---|---|---|---|
| 2014/0217970 A1 | 8/2014 | Tabata et al. | |
| 2015/0008875 A1 | 1/2015 | Huang et al. | |
| 2016/0161052 A1* | 6/2016 | Griggs | F16B 1/00 320/108 |
| 2016/0368748 A1 | 12/2016 | Doherty | |
| 2017/0005687 A1 | 1/2017 | Nyholm et al. | |
| 2017/0214260 A1 | 7/2017 | Kim | |
| 2017/0297438 A1* | 10/2017 | Park | B60L 53/122 |

FOREIGN PATENT DOCUMENTS

| | | |
|---|---|---|
| KR | 10-1529469 B1 | 6/2015 |
| KR | 10-2016-0149598 A | 12/2016 |
| KR | 10-1700339 B1 | 1/2017 |
| WO | 2012/099965 A2 | 7/2012 |
| WO | 2016/090109 A1 | 6/2016 |

OTHER PUBLICATIONS

Communication pursuant to Article 94(3) EPC dated Sep. 25, 2020 in connection with European Patent Application No. 18 761 693.3, 4 pages.

ISA/KR, International Search Report and Written Opinion of the International Searching Authority, International Application No. PCT/KR2018/002455, dated Jun. 20, 2018, 11 pages.

Notification of Preliminary Rejection dated Aug. 6, 2021, in connection with Korean Application No. 10-2017-0027021, 17 pages.

* cited by examiner

WIRELESS CHARGING STAND, AND METHOD FOR OPERATING ELECTRONIC DEVICE LINKED THERETO

CROSS-REFERENCE TO RELATED APPLICATIONS

This application is a 371 National Stage of International Application No. PCT/KR2018/002455, filed Feb. 28, 2018, which claims priority to Korean Patent Application No. 10-2017-0027021, filed Mar. 2, 2017, the disclosures of which are herein incorporated by reference in their entirety.

BACKGROUND

1. Field

Various embodiments of the disclosure relate to a wireless charging stand and an operating method of an electronic device linked thereto.

2. Description of Related Art

With the development of electronic communication industries, electronic devices such as mobile communication terminals (tablet personal computers (PCs), smartphones, etc.), electronic schedulers, personal multi-function terminals, televisions (TVs), or lap top computers are becoming necessities in modern society, and are serving as important means for delivering rapidly changing information. Electronic devices have developed to be able to help users easily perform their tasks through a graphical user interface (GUI) environment, and to provide various multimedia based on a web environment.

Electronic devices are changing in various ways according to the current trend toward maximization of portability, and also provide user convenience by fulfilling various additional functions. For example, an electronic device may be held at a predetermined angle by a separate holding member (for example, a stand), thereby allowing a user to enjoy a video, and a separate protection case may be provided to cover at least part of the electronic device, thereby protecting the exterior of the electronic device when it is carried. Such additional devices can make use of electronic devices more convenient, and are developing to be more useful.

SUMMARY

An electronic device having a relatively large screen display, such as a tablet PC, may be held by a separate holding member (for example, a stand) at a favorable angle for a user to easily view it. Such an electronic device may charge a battery disposed therein wiredly through a separate connector port.

A large electronic device such as a tablet PC may provide the advantage of providing a large screen in comparison to a small electronic device having a relatively small volume, such as a smartphone, but may not realize the advantages of small electronic devices due to its size and weight. Accordingly, there may be a problem that the large electronic device should be held by a holding member and should be separately charged by a separate charging device.

According to various embodiments, there are provided a wireless charging stand which is configured to hold and perform wireless charging simultaneously, and an operating method of an electronic device linked thereto.

According to various embodiments, there are provided a wireless charging stand which can be intuitively mounted based on a user experience, and an operating method of an electronic device linked thereto.

According to various embodiments, there are provided a wireless charging stand which provides a user customized screen according to holding information of an electronic device held by the stand, thereby enhancing convenience of the device, and an operating method of an electronic device linked thereto.

According to various embodiments, there is provided a stand for holding an electronic device, the stand including: a stand housing; a wireless power transmission member disposed in an inner space of the stand housing; and at least one magnet disposed in the proximity of the wireless power transmission member, wherein the stand is attached to an outer surface of the electronic device in such a way that at least one attachment member disposed in an inner space of the electronic device is attached by a magnetic force of the magnet, and is configured to provide wireless power to the electronic device through the wireless power transmission member.

According to various embodiments, there is provided an electronic device, including: a housing including a first surface facing in a first direction, a second surface facing in a second direction opposite to the first direction, and a side surface formed along edges of the first surface and the second surface to provide an inner space; a display exposed on a least a part of the first surface; a first attachment member disposed in a first area in the inner space in the second direction, and formed with a material that is attracted by a magnetic force of a magnet included in a stand attached to an outer surface of the electronic device corresponding to the first area; a second attachment member disposed in a second area in the inner space in the second direction, and formed with a material that is attracted by the magnetic force of the magnet included in the stand attached to an outer surface of the electronic device corresponding to the second area; and at least one wireless power reception member disposed in the inner space, and configured to receive wireless power from a wireless power transmission member of the stand which is selectively attached to an outer surface of the electronic device corresponding to the first area or the second area.

According to various embodiments, there is provided a holding system including an electronic device, and a stand coming into contact with at least a part of the electronic device to hold the electronic device.

The electronic device may include: a first attachment member disposed in a first area in an inner space of the electronic device, and formed with a material that is attracted by a magnetic force of a magnet included in the stand which is attached to an outer surface of the electronic device corresponding to the first area; a second attachment member disposed in a second area in the inner space of the electronic device, and formed with a material that is attracted by the magnetic force of the magnet included in the stand which is attached to an outer surface of the electronic device corresponding to the second area; and at least one wireless power reception member disposed in the inner space of the electronic device to receive wireless power from the stand.

The stand may include: a wireless power transmission member disposed in an inner space of the stand to provide wireless power to the wireless power reception member; and at least one magnet disposed in the inner space of the stand to provide a magnetic force to be coupled to the first attachment member or the second attachment member.

When the stand is attached to an outer surface of the electronic device by the magnetic force of the magnet, wireless charging may be performed in the electronic device from the stand.

According to various embodiments, there is provided an operating method of an electronic device, the method including: determining whether a stand is mounted by detecting a magnetic force of at least one magnet included in the stand; when the stand is mounted, identifying whether the electronic device is held in a landscape mode; and, when the electronic device is in the landscape mode, executing at least one first program.

According to various embodiments, there is provided a stand for holding an electronic device, including: an attachment portion including a magnet to be attached to at least a part of the electronic device by a magnetic force, and a wireless power transmission member for providing wireless power to the electronic device; a support extended from the attachment portion to support the electronic device attached to the attachment portion; a bottom support extended from an end of the support to come into contact with a holding surface; and a cable electrically connected with the wireless power transmission member through the bottom support, the support, and the attachment portion to provide external power.

According to various embodiments, the electronic device can be held and simultaneously can be charged through one stand, and the electronic device provides a user customized screen according to holding information provided from the stand, such that user convenience can be enhanced.

DETAILED DESCRIPTION

Figure 1:
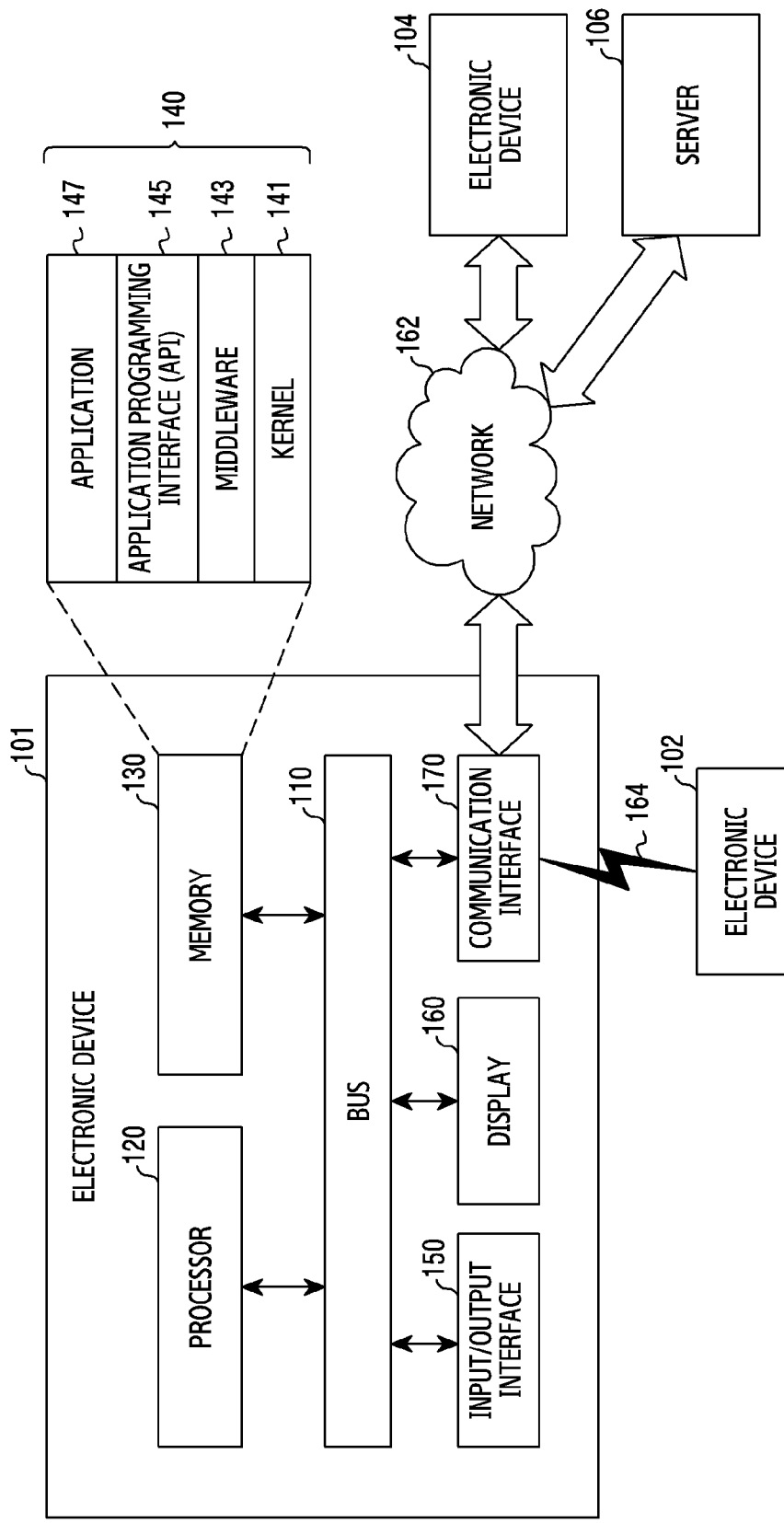
FIG. 1 is a view illustrating a network environment including an electronic device according to various embodiments of the disclosure.

Hereinafter, various embodiments of the present disclosure are disclosed with reference to the accompanying drawings. However, the present disclosure is not intended to be limited by the various embodiments of the present disclosure to a specific embodiment and it is intended that the present disclosure covers all modifications, equivalents, and/or alternatives of the present disclosure provided they come within the scope of the appended claims and their equivalents. With respect to the descriptions of the accompanying drawings, like reference numerals refer to like elements.

The term "include," "comprise," and "have", or "may include," or "may comprise" and "may have" used herein indicates disclosed functions, operations, or existence of elements but does not exclude other functions, operations or elements.

As used herein, the expressions "A or B" or "at least one of A and/or B" may include any one of, or all possible combinations of items enumerated together in a corresponding one of the expressions. For instance, the expression "A or B" or "at least one of A and/or B" may indicate (1) at least one A, (2) at least one B, or (3) both at least one A and at least one B.

As used herein, such terms as "1st" and "2nd," or "first" and "second" may be used to simply distinguish a corresponding component from another, and does not limit the components in other aspect (e.g., importance or order). For instance, "a first user device" and "a second user device" may indicate different users regardless of order or importance. For example, a first component may be referred to as a second component and vice versa without departing from the scope and spirit of the present disclosure.

In various embodiments of the present disclosure, it is intended that when a component (for example, a first component) is referred to as being "operatively or communicatively coupled with/to" or "connected to" another component (for example, a second component), the component may be directly connected to the other component or connected through another component (for example, a third component). In various embodiments of the present disclosure, it is intended that when a component (for example, a first component) is referred to as being "directly connected to" or "directly accessed" another component (for example, a second component), another component (for example, a third component) does not exist between the component (for example, the first component) and the other component (for example, the second component).

The expression "configured to" used in various embodiments of the present disclosure may be interchangeably used with "suitable for," "having the capacity to," "designed to," "adapted to," "made to," or "capable of" according to the situation, for example. The term "configured to" may not necessarily indicate "specifically designed to" in terms of hardware. Instead, the expression "a device configured to" in some situations may indicate that the device and another device or part are "capable of" For example, the expression "a processor configured to perform A, B, and C" may indicate a dedicated processor (for example, an embedded processor) for performing a corresponding operation or a general purpose processor (for example, a central processing unit (CPU) or application processor (AP)) for performing corresponding operations by executing at least one software program stored in a memory device.

Terms used in various embodiments of the present disclosure are used to describe certain embodiments of the present disclosure, but are not intended to limit the scope of other embodiments. The terms of a singular form may include plural forms unless they have a clearly different meaning in the context. Otherwise, all terms used herein may have the same meanings that are generally understood by a person skilled in the art. In general, terms defined in a dictionary should be considered to have the same meanings as the contextual meaning of the related art, and, unless clearly defined herein, should not be understood differently or as having an excessively formal meaning. In any case, even the terms defined in the present specification are not intended to be interpreted as excluding embodiments of the present disclosure.

An electronic device according to various embodiments of the present disclosure may include at least one of a smartphone, a tablet personal computer (PC), a mobile phone, a video telephone, an electronic book reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a camera, or a wearable device. The wearable device may include at least one of an accessory-type device (e.g., a watch, a ring, a bracelet, an anklet, a necklace, glasses, a contact lens, a head-mounted device (HMD)), a textile- or clothing-integrated-type device (e.g., an electronic apparel), a body-attached-type device (e.g., a skin pad or a tattoo), or a bio-implantable-type device (e.g., an implantable circuit).

In some various embodiments of the present disclosure, an electronic device may be a home appliance. The smart home appliance may include at least one of, for example, a television (TV), a digital video/versatile disc (DVD) player, an audio, a refrigerator, an air conditioner, a cleaner, an oven, a microwave oven, a washing machine, an air cleaner, a set-top box, a home automation control panel, a security control panel, a television (TV) box (e.g., Samsung Home-Sync™, Apple TV™, or Google TV™), a game console (e.g., Xbox™ or PlayStation™), an electronic dictionary, an electronic key, a camcorder, or an electronic picture frame.

In other various embodiments of the present disclosure, an electronic device may include at least one of various medical devices (e.g., various portable medical measurement devices (e.g., a blood glucose measuring device, a heart rate measuring device, a blood pressure measuring device, a body temperature measuring device, or the like), a magnetic resonance angiography (MRA), a magnetic resonance imaging (MRI), a computed tomography (CT), a scanner, an ultrasonic device, or the like), a navigation device, a global navigation satellite system (GNSS), an event data recorder (EDR), a flight data recorder (FDR), a vehicle infotainment device, electronic equipment for vessels (e.g., a navigation system, a gyrocompass, or the like), avionics, a security device, a head unit for a vehicle, an industrial or home robot, an automatic teller machine (ATM), a point of sales (POS) device of a store, or an Internet of things (IoT) device (e.g., a light bulb, various sensors, an electric or gas meter, a sprinkler, a fire alarm, a thermostat, a streetlamp, a toaster, exercise equipment, a hot water tank, a heater, a boiler, or the like).

According to various embodiments of the present disclosure, an electronic device may include at least one of a part of furniture or a building/structure, an electronic board, an electronic signature receiving device, a projector, or a measuring instrument (e.g., a water meter, an electricity meter, a gas meter, a wave meter, or the like). An electronic device may be one or more combinations of the above-mentioned devices. An electronic device according to some various embodiments of the present disclosure may be a flexible device. An electronic device according to an embodiment of the present disclosure is not limited to the above-mentioned devices, and may include new electronic devices with the development of new technology.

Hereinafter, an electronic device according to various embodiments of the present disclosure will be described in more detail with reference to the accompanying drawings. The term "user" used herein may refer to a person who uses an electronic device or may refer to a device (e.g., an artificial intelligence electronic device) that uses an electronic device.

FIG. 1 illustrates an electronic device in a network environment according to an embodiment of the present disclosure.

An electronic device 101 in a network environment 100 according to various embodiments of the present disclosure will be described with reference to FIG. 1. The electronic device 101 may include a bus 110, a processor 120, a memory 130, an input/output interface 150, a display 160, and a communication interface 170. In various embodiments of the present disclosure, at least one of the foregoing elements may be omitted or another element may be added to the electronic device 101.

The bus 110 may include a circuit for connecting the above-mentioned elements 110 to 170 to each other and transferring communications (e.g., control messages and/or data) among the above-mentioned elements.

The processor 120 may include at least one of a central processing unit (CPU), an application processor (AP), or a communication processor (CP). The processor 120 may perform data processing or an operation related to communication and/or control of at least one of the other elements of the electronic device 101.

The memory 130 may include a volatile memory and/or a nonvolatile memory. The memory 130 may store instructions or data related to at least one of the other elements of the electronic device 101. According to an embodiment of the present disclosure, the memory 130 may store software and/or a program 140. The program 140 may include, for example, a kernel 141, a middleware 143, an application programming interface (API) 145, and/or an application program (or an application) 147. At least a portion of the kernel 141, the middleware 143, or the API 145 may be referred to as an operating system (OS).

The kernel 141 may control or manage system resources (e.g., the bus 110, the processor 120, the memory 130, or the like) used to perform operations or functions of other programs (e.g., the middleware 143, the API 145, or the application program 147). Furthermore, the kernel 141 may provide an interface for allowing the middleware 143, the API 145, or the application program 147 to access individual elements of the electronic device 101 in order to control or manage the system resources.

The middleware 143 may serve as an intermediary so that the API 145 or the application program 147 communicates and exchanges data with the kernel 141.

Furthermore, the middleware 143 may handle one or more task requests received from the application program 147 according to a priority order. For example, the middleware 143 may assign at least one application program 147 a priority for using the system resources (e.g., the bus 110, the processor 120, the memory 130, or the like) of the electronic device 101. For example, the middleware 143 may handle the one or more task requests according to the priority assigned to the at least one application, thereby performing scheduling or load balancing with respect to the one or more task requests.

The API 145, which is an interface for allowing the application 147 to control a function provided by the kernel 141 or the middleware 143, may include, for example, at least one interface or function (e.g., instructions) for file control, window control, image processing, character control, or the like.

The input/output interface 150 may serve to transfer an instruction or data input from a user or another external device to (an)other element(s) of the electronic device 101. Furthermore, the input/output interface 150 may output instructions or data received from (an)other element(s) of the electronic device 101 to the user or another external device.

The display 160 may include, for example, a liquid crystal display (LCD), a light-emitting diode (LED) display, an organic light-emitting diode (OLED) display, a microelectromechanical systems (MEMS) display, or an electronic paper display. The display 160 may present various content (e.g., a text, an image, a video, an icon, a symbol, or the like) to the user. The display 160 may include a touch screen, and may receive a touch, gesture, proximity or hovering input from an electronic pen or a part of a body of the user.

The communication interface 170 may set communications between the electronic device 101 and an external device (e.g., a first external electronic device 102, a second external electronic device 104, or a server 106). For example, the communication interface 170 may be connected to a network 162 via wireless communications or wired communications so as to communicate with the external device (e.g., the second external electronic device 104 or the server 106).

The wireless communications may employ at least one of cellular communication protocols such as long-term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM). The wireless communications may include, for example, a short-range communications 164. The short-range communications may include at least one of wireless fidelity (Wi-Fi), Bluetooth, near field communication (NFC), or global navigation satellite system (GNSS). The GNSS may include, for example, at least one of global positioning system (GPS), global navigation satellite system (GLONASS), BeiDou navigation satellite system (BeiDou), or Galileo, the European global satellite-based navigation system according to a use area or a bandwidth. Hereinafter, the term "GPS" and the term "GNSS" may be interchangeably used. The wired communications may include at least one of universal serial bus (USB), high definition multimedia interface (HDMI), recommended standard 232 (RS-232), plain old telephone service (POTS), or the like. The network 162 may include at least one of telecommunications networks, for example, a computer network (e.g., local area network (LAN) or wide area network (WAN)), the Internet, or a telephone network.

The types of the first external electronic device 102 and the second external electronic device 104 may be the same as or different from the type of the electronic device 101. According to an embodiment of the present disclosure, the server 106 may include a group of one or more servers. A portion or all of operations performed in the electronic device 101 may be performed in one or more other electronic devices (e.g., the first electronic device 102, the second external electronic device 104, or the server 106). When the electronic device 101 should perform a certain function or service automatically or in response to a request, the electronic device 101 may request at least a portion of functions related to the function or service from another device (e.g., the first electronic device 102, the second external electronic device 104, or the server 106) instead of or in addition to performing the function or service for itself. The other electronic device (e.g., the first electronic device 102, the second external electronic device 104, or the server 106) may perform the requested function or additional function, and may transfer a result of the performance to the electronic device 101. The electronic device 101 may use a received result itself or additionally process the received result to provide the requested function or service. To this end, for example, a cloud computing technology, a distributed computing technology, or a client-server computing technology may be used.

Figure 2:
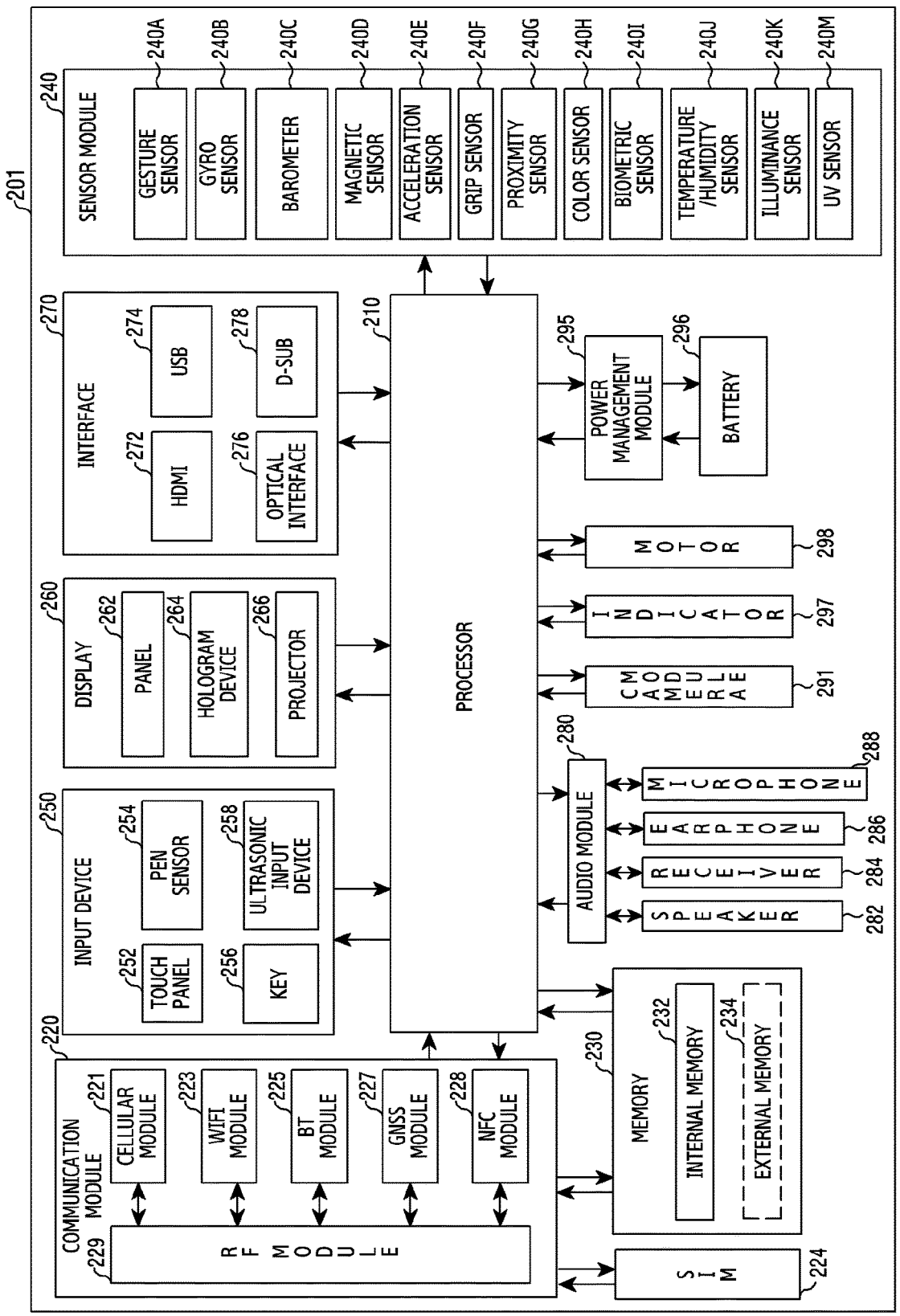
FIG. 2 is a view illustrating a block diagram of an electronic device according to various embodiments of the disclosure.

FIG. 2 is a block diagram illustrating an electronic device according to an embodiment of the present disclosure.

Referring to FIG. 2, an electronic device 201 may include, for example, a part or the entirety of the electronic device 101 illustrated in FIG. 1. The electronic device 201 may include at least one processor (e.g., AP) 210, a communication module 220, a subscriber identification module (SIM) 224, a memory 230, a sensor module 240, an input device 250, a display 260, an interface 270, an audio module 280, a camera module 291, a power management module 295, a battery 296, an indicator 297, and a motor 298.

The processor 210 may run an operating system or an application program so as to control a plurality of hardware or software elements connected to the processor 210, and may process various data and perform operations. The processor 210 may be implemented with, for example, a system on chip (SoC). According to an embodiment of the present disclosure, the processor 210 may further include a graphic processing unit (GPU) and/or an image signal processor. The processor 210 may include at least a portion (e.g., a cellular module 221) of the elements illustrated in FIG. 2. The processor 210 may load, on a volatile memory, an instruction or data received from at least one of other elements (e.g., a nonvolatile memory) to process the instruction or data, and may store various data in a nonvolatile memory.

The communication module 220 may have a configuration that is the same as or similar to that of the communication interface 170 of FIG. 1. The communication module 220 may include, for example, a cellular module 221, a Wi-Fi module 223, a Bluetooth (BT) module 225, a GNSS module 227 (e.g., a GPS module, a GLONASS module, a BeiDou module, or a Galileo module), a NFC module 228, and a radio frequency (RF) module 229.

The cellular module 221 may provide, for example, a voice call service, a video call service, a text message service, or an Internet service through a communication network. The cellular module 221 may identify and authenticate the electronic device 201 in the communication network using the subscriber identification module 224 (e.g., a SIM card). The cellular module 221 may perform at least a part of functions that may be provided by the processor 210. The cellular module 221 may include a communication processor (CP).

Each of the Wi-Fi module 223, the Bluetooth module 225, the GNSS module 227 and the NFC module 228 may include, for example, a processor for processing data transmitted/received through the modules. According to some various embodiments of the present disclosure, at least a part (e.g., two or more) of the cellular module 221, the Wi-Fi module 223, the Bluetooth module 225, the GNSS module 227, and the NFC module 228 may be included in a single integrated chip (IC) or IC package.

The RF module 229 may transmit/receive, for example, communication signals (e.g., RF signals). The RF module 229 may include, for example, a transceiver, a power amp module (PAM), a frequency filter, a low noise amplifier (LNA), an antenna, or the like. According to another embodiment of the present disclosure, at least one of the cellular module 221, the Wi-Fi module 223, the Bluetooth module 225, the GNSS module 227, or the NFC module 228 may transmit/receive RF signals through a separate RF module.

The SIM 224 may include, for example, an embedded SIM and/or a card containing the subscriber identity module, and may include unique identification information (e.g., an integrated circuit card identifier (ICCID)) or subscriber information (e.g., international mobile subscriber identity (IMSI)).

The memory 230 (e.g., the memory 130) may include, for example, an internal memory 232 or an external memory 234. The internal memory 232 may include at least one of a volatile memory (e.g., a dynamic RAM (DRAM), a static RAM (SRAM), a synchronous dynamic RAM (SDRAM), or the like), a nonvolatile memory (e.g., a one-time programmable ROM (OTPROM), a programmable ROM (PROM), an erasable and programmable ROM (EPROM), an electrically erasable and programmable ROM (EEPROM), a mask ROM, a flash ROM, a flash memory (e.g., a NAND flash memory, a NOR flash memory, or the like)), a hard drive, or a solid state drive (SSD).

The external memory 234 may include a flash drive such as a compact flash (CF), a secure digital (SD), a Micro-SD, a Mini-SD, an extreme digital (xD), a MultiMediaCard (MMC), a memory stick, or the like. The external memory 234 may be operatively and/or physically connected to the electronic device 201 through various interfaces.

The sensor module 240 may, for example, measure physical quantity or detect an operation state of the electronic device 201 so as to convert measured or detected information into an electrical signal. The sensor module 240 may include, for example, at least one of a gesture sensor 240A, a gyro sensor 240B, a barometer 240C, a magnetic sensor 240D, an acceleration sensor 240E, a grip sensor 240F, a proximity sensor 240G, a color sensor 240H (e.g., a red/green/blue (RGB) sensor), a biometric sensor 240I, a temperature/humidity sensor 240J, an illuminance sensor 240K, or an ultraviolet (UV) sensor 240M. Additionally or alternatively, the sensor module 240 may include, for example, an olfactory sensor (E-nose sensor), an electromyography (EMG) sensor, an electroencephalogram (EEG) sensor, an electrocardiogram (ECG) sensor, an infrared (IR) sensor, an iris scan sensor, an ultrasonic sensor, and/or a finger scan sensor. The sensor module 240 may further include a control circuit for controlling at least one sensor included therein. In some various embodiments of the present disclosure, the electronic device 201 may further include a processor configured to control the sensor module 240 as a part of the processor 210 or separately, so that the sensor module 240 is controlled while the processor 210 is in a sleep state.

The input device 250 may include, for example, a touch panel 252, a (digital) pen sensor 254, a key 256, or an ultrasonic input device 258. The touch panel 252 may employ at least one of capacitive, resistive, infrared, and ultraviolet sensing methods. The touch panel 252 may further include a control circuit. The touch panel 252 may further include a tactile layer so as to provide a haptic feedback to a user.

The (digital) pen sensor 254 may include, for example, a sheet for recognition which is a part of a touch panel or is separate. The key 256 may include, for example, a physical button, an optical button, or a keypad. The ultrasonic input device 258 may sense ultrasonic waves generated by an input tool through a microphone 288 so as to identify data corresponding to the ultrasonic waves sensed.

The display 260 (e.g., the display 160) may include a panel 262, a hologram device 264, or a projector 266. The panel 262 may have a configuration that is the same as or similar to that of the display 160 of FIG. 1. The panel 262 may be, for example, flexible, transparent, or wearable. The panel 262 and the touch panel 252 may be integrated into a single module. According to an embodiment, the panel 262 may include a pressure sensor (interchangeably, a force sensor) which is able to measure the intensity of the pressure by the touch. The pressure sensor may be implemented integrally with the touch panel 252 or may be implemented with at least one sensor separately from the touch panel 252. The hologram device 264 may display a stereoscopic image in a space using a light interference phenomenon. The projector 266 may project light onto a screen so as to display an image. The screen may be disposed in the inside or the outside of the electronic device 201. According to an embodiment of the present disclosure, the display 260 may further include a control circuit for controlling the panel 262, the hologram device 264, or the projector 266.

The interface 270 may include, for example, an HDMI 272, a USB 274, an optical interface 276, or a D-subminiature (D-sub) 278. The interface 270, for example, may be included in the communication interface 170 illustrated in FIG. 1. Additionally or alternatively, the interface 270 may include, for example, a mobile high-definition link (MHL) interface, an SD card/multi-media card (MMC) interface, or an infrared data association (IrDA) interface.

The audio module 280 may convert, for example, a sound into an electrical signal or vice versa. At least a portion of elements of the audio module 280 may be included in the input/output interface 150 illustrated in FIG. 1. The audio module 280 may process sound information input or output through a speaker 282, a receiver 284, an earphone 286, or the microphone 288.

The camera module 291 is, for example, a device for shooting a still image or a video. According to an embodiment of the present disclosure, the camera module 291 may include at least one image sensor (e.g., a front sensor or a rear sensor), a lens, an image signal processor (ISP), or a flash (e.g., an LED or a xenon lamp).

The power management module 295 may manage power of the electronic device 201. According to an embodiment of the present disclosure, the power management module 295 may include a power management integrated circuit (PMIC), a charger integrated circuit (IC), or a battery or gauge. The PMIC may employ a wired and/or wireless charging method. The wireless charging method may include, for example, a magnetic resonance method, a magnetic induction method, an electromagnetic method, or the like. An additional circuit for wireless charging, such as a coil loop, a resonant circuit, a rectifier, or the like, may be further included. The battery gauge may measure, for example, a remaining capacity of the battery 296 and a voltage, current or temperature thereof while the battery is charged. The battery 296 may include, for example, a rechargeable battery and/or a solar battery.

The indicator 297 may display a specific state of the electronic device 201 or a part thereof (e.g., the processor 210), such as a booting state, a message state, a charging state, or the like. The motor 298 may convert an electrical signal into a mechanical vibration, and may generate a vibration or haptic effect. Although not illustrated, a processing device (e.g., a GPU) for supporting a mobile TV may be included in the electronic device 201. The processing device for supporting a mobile TV may process media data according to the standards of digital multimedia broadcasting (DMB), digital video broadcasting (DVB), Media-FLO™, or the like.

According to various embodiments, the processor 210 may determine whether a stand is mounted by detecting magnetic force of at least one magnet disposed in a holding portion of the stand through the magnetic sensor 240D (for example, a hall sensor). According to an embodiment, when it is determined that the electronic device is held by the stand, the processor 210 may identify holding information of the electronic device through the gyro sensor 240B. According to an embodiment, when it is determined that the electronic device is held by the stand in a horizontal direction (for example, a landscape mode), the processor 210 may execute at least one first program corresponding to the landscape mode. According to an embodiment, when it is determined that the electronic device is held by the stand in a vertical direction (for example, a portrait mode), the processor 210 may execute at least one second program corresponding to the portrait mode. According to an embodiment, the processor 210 may selectively execute the first program and the second program stored in the memory 230. According to an embodiment, the processor 210 may detect a removal from the stand and may return the electronic device to a default mode.

In an exemplary embodiment of the disclosure, the first program and the second program may be outputted through the display. However, this should not be considered as limiting, and the processor 210 may control an output through an auditory output means (for example, a speaker device) or a tactile output means (for example, a vibrator) disposed in the electronic device through the first program and the second program.

Each of the elements described in the disclosure may be configured with one or more components, and the names of the elements may be changed according to the type of the electronic device. In various embodiments, the electronic device may be configured with at least one of the elements described in the disclosure, and some elements may be omitted or other additional elements may be added. Furthermore, some of the elements of the electronic device according to various embodiments may be combined with each other so as to form one entity, and the functions of the elements may be performed in the same manner as before being combined.

Figure 3A:
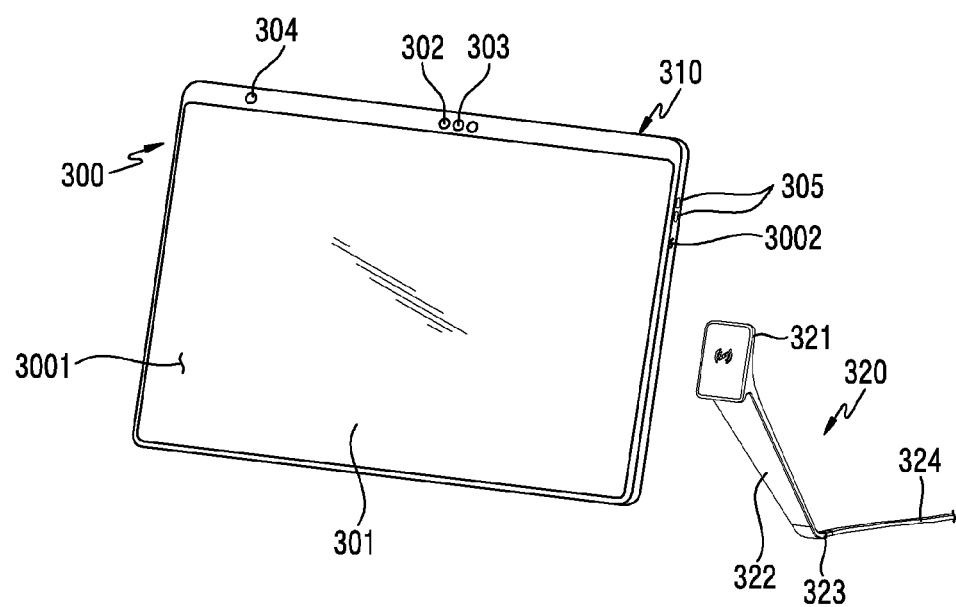
FIGS. 3A and 3B are views illustrating a state in which an electronic device is held by a stand according to various embodiments of the disclosure.
Figure 3B:
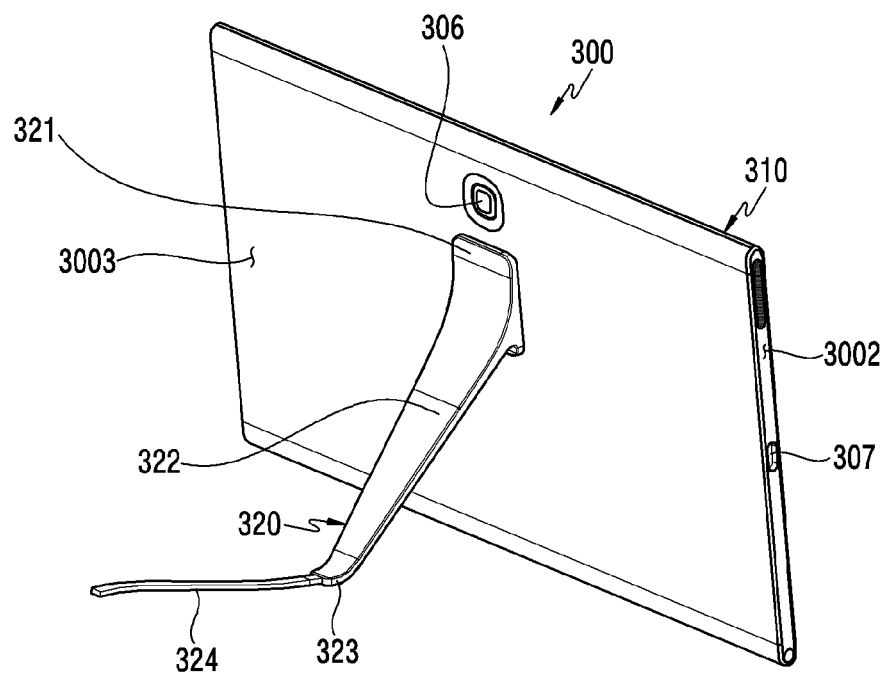

FIGS. 3A and 3B are views illustrating a state in which an electronic device is held by a stand according to various embodiments of the disclosure.

Referring to FIGS. 3A and 3B, the electronic device 300 may include a housing 310. According to an embodiment, the housing 310 may be formed of a conductive member and/or a nonconductive member. According to an embodiment, the housing 310 may include a first surface 3001 (for example, a front surface) facing in a first direction, a second surface 3003 (for example, a rear surface) spaced apart from the first surface 3001 and facing in a second direction opposite to the first direction, and a side surface 3002 disposed to surround edges of the first surface 3001 and the second surface 3003 to provide an inner space of the electronic device 300.

According to various embodiments, a display 301 including a window (for example, a front window or a glass plate) may be disposed on the first surface 3001 of the housing 310. According to an embodiment, the display 301 may include a touch sensor and may operate as a touch screen device. According to an embodiment, the display 301 may further include a pressure sensor and may operate as a pressure reactive touch screen device. According to an embodiment, the electronic device 300 may include a speaker device 305 disposed in the housing 310 to output a voice or a sound. According to an embodiment, the electronic device 300 may include a microphone device (not shown) disposed in the housing 310 to transmit a user's voice to the other user.

According to various embodiments, the electronic device 300 may include components which are exposed to the display 301 or perform functions through the window, but are not exposed, and perform various functions of the electronic device 300. According to an embodiment, the components may include a front-facing camera device 302. According to an embodiment, the components may include at least one sensor module 303. The sensor module 303 may include at least one of, for example, an illuminance sensor (for example, a light sensor), a proximity sensor (for example, a light sensor), an infrared sensor, an ultrasonic sensor, a fingerprint recognition sensor or an iris recognition sensor. According to an embodiment, the components may include an indicator 304 (for example, an LED device) for notifying a user of state information of the electronic device.

According to various embodiments, the electronic device 300 may include a rear-facing camera device 306 disposed on the second surface 3003 of the housing 310. The electronic device 300 may include at least one component disposed on the second surface 3003 although it is not illustrated. According to an embodiment, the components may include at least one of an illuminance sensor (for example, a light sensor), a proximity sensor (for example, a light sensor), an infrared sensor, an ultrasonic sensor, a heartrate sensor, a flash device, and a fingerprint recognition sensor. According to an embodiment, the electronic device 300 may include an interface connector port 307 disposed to perform a data transmission and reception function by an external device and to charge the electronic device 300 wiredly by receiving external power. The electronic device may include an ear jack hole although it is not illustrated.

According to various embodiments, the stand 320 may include a holding portion 321 (for example, an attachment portion) to be attachably or detachably coupled to at least a part of the second surface 3002 of the electronic device 300, a leg 322 (for example, a support) extended from the holding portion 321 by a predetermined length and at a predetermined angle, and a base 323 (for example, a bottom support) extended from an end of the leg 322 to easily come into contact with a holding surface (for example, a desk surface). According to an embodiment, the holding portion 321, the leg 322, and the base 323 may be integrally formed with one another. According to an embodiment, the stand 320 may be formed with at least one material of a synthetic resin material, a metallic material, a glass material, a fiber material, or a material having elasticity (for example, rubber, urethane, or silicon). According to an embodiment, when the stand 320 is formed with different kinds of materials, the stand 320 may be formed by double injection molding or insert injection molding.

According to various embodiments, at least one magnet (for example, one pair of magnets 431, 432 of FIG. 4A) disposed in the holding portion 321 may be attached to at least one attachment member disposed on a corresponding position of the second surface 3002 of the electronic device 300 by magnetic force, such that the stand 320 is coupled to the electronic device. According to an embodiment, the stand 320 may include a wireless power transmission member (for example, a wireless power transmission member 420 of FIG. 4A) disposed in the holding portion 321. According to an embodiment, the wireless power transmission member may operate by receiving external power through a cable 324 penetrating through the holding member 321, the leg 322, and the base 323. According to an embodiment, the electronic device 300 may receive power provided from the wireless power transmission member disposed in the holding portion 321 through a wireless power reception member disposed in the second surface 3003, and may charge an internal power source (for example, a battery). Accordingly, the electronic device 300 performs a wireless charging operation while being held by the stand 320, such that user convenience can be enhanced.

According to various embodiments, the base 323 may be disposed with a plurality of unit bases (not shown) being connected with one another. According to an embodiment, the cable 324 supplying external power to the stand 320 may be attachably and detachably disposed on the base 323. For example, a connector port (not shown) may be provided on the base 323, and a connector (not shown) may be provided at an end of the cable 324 to be connected to the connector port. Accordingly, when the cable 324 is not connected to the base 323, the stand 323 may be used only for the purpose of holding, not for the purpose of charging.

According to various embodiments, a member (not shown) for preventing slip and buffering may be disposed on a bottom surface (for example, a surface corresponding to a holding surface) of the base 323. According to an embodiment, the member may include various members capable of providing friction, such as rubber, urethane, or silicon. However, this should not be considered as limiting, and the base 323 may be formed with a material such as rubber, urethane, or silicon.

According to various embodiments, the electronic device 300 may detect mounting of the stand 320, and, when the stand 320 is detected, the electronic device 300 may determine a holding mode of the electronic device 300. According to an embodiment, the electronic device 300 may drive an appropriate program according to the determined holding mode, such that user convenience of the electronic device 300 can be enhanced.

Hereinafter, an operating method of an electronic device will be described in detail.

Figure 4A:
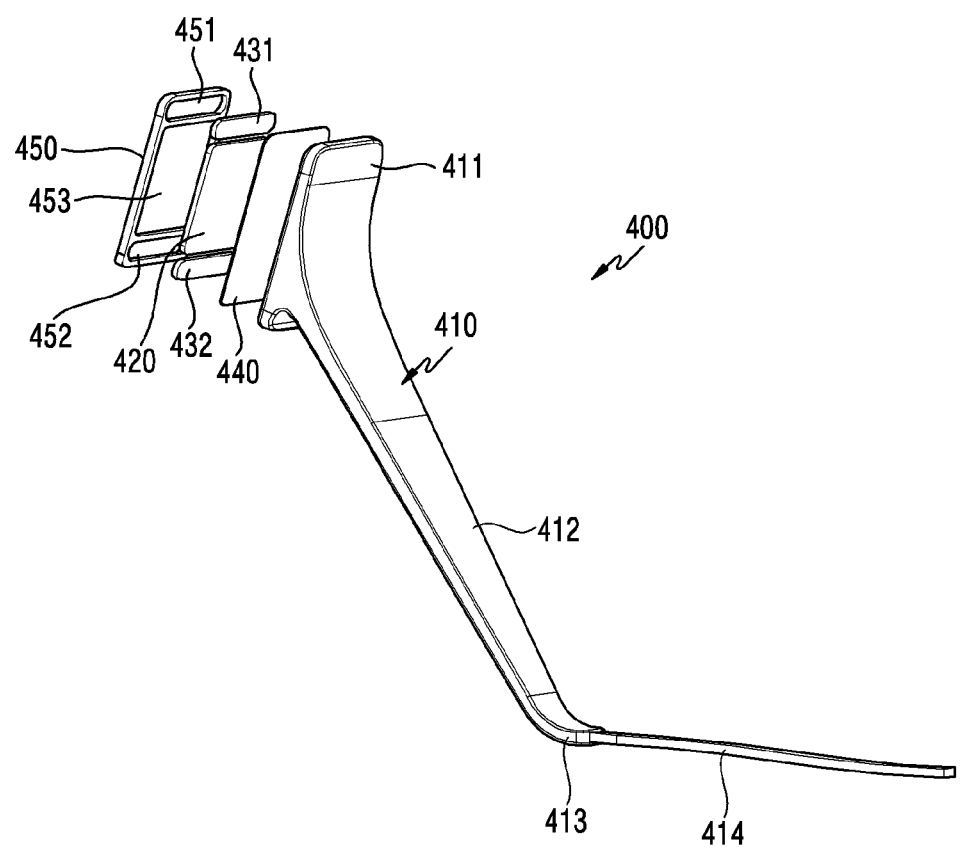
FIG. 4A is an exploded perspective view of a stand according to various embodiments of the disclosure.
Figure 4B:
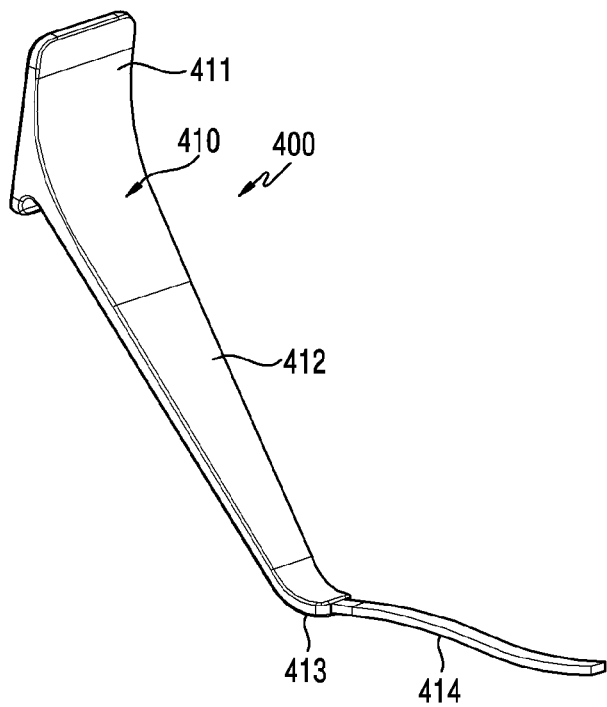
FIG. 4B is a perspective view of the stand in an assembled state according to various embodiments of the disclosure.

FIG. 4A is an exploded perspective view of a stand according to various embodiments of the disclosure. FIG. 4B is a perspective view of the stand in an assembled state according to various embodiments of the disclosure.

The stand 400 of FIGS. 4A and 4B may be similar to the stand 320 of FIGS. 3A and 3B, or may include other embodiments of the stand.

Referring to FIGS. 4A and 4B, the stand 400 (for example, the stand 320 of FIG. 3A) may include a stand housing 410, and a wireless power transmission member 420, one pair of magnets 431, 432, and a cover 450 which are disposed in the stand housing 410 in sequence.

According to various embodiments, the stand housing 410 may include a holding portion 411 including a space formed in a mounting direction of the electronic device (for example, the electronic device 300 of FIG. 3A), a leg 412 (for example, the leg 322 of FIG. 3A) extended from the holding portion 411 by a predetermined length and at a predetermined angle, and a base 413 (for example, the base 323 of FIG. 3A) extended from the leg 412 to come into contact with a holding surface (for example, a desk surface).

According to various embodiments, at least part of the wireless power transmission member 420 and the one pair of magnets 431, 432 may be seated in the space of the holding portion 411 through an adhesive member 440 (for example, a double-sided tape or a bonding member). According to an embodiment, the wireless power transmission member 420 and the one pair of magnets 431, 432 may be mounted to have the same plane, and may be regulated by the cover coupled to the holding portion. According to an embodiment, the cover may include a plurality of seating recesses 451, 452, 453 formed to receive at least part of the wireless power transmission member 420 and the one pair of magnets 431, 432 attached to the holding portion 411 by means of the adhesive member 440. Accordingly, the wireless power transmission member 420 and the one pair of magnets 431, 432 are seated in the plurality of seating recesses 451, 452, 453, such that movement in the holding portion can be prevented even when an external shock is applied to the stand. According to an embodiment, the stand 400 may include a cable (not shown) disposed to penetrate through the holding portion 411, the leg 412, and the base 413 to apply external power to the wireless power transmission member 420.

Figure 5A:
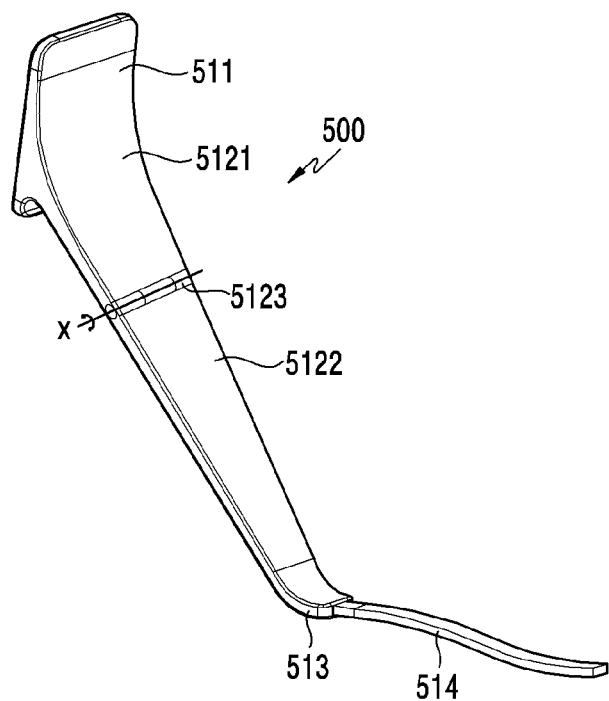
FIG. 5A is a perspective of a stand according to various embodiments of the disclosure.
Figure 5B:
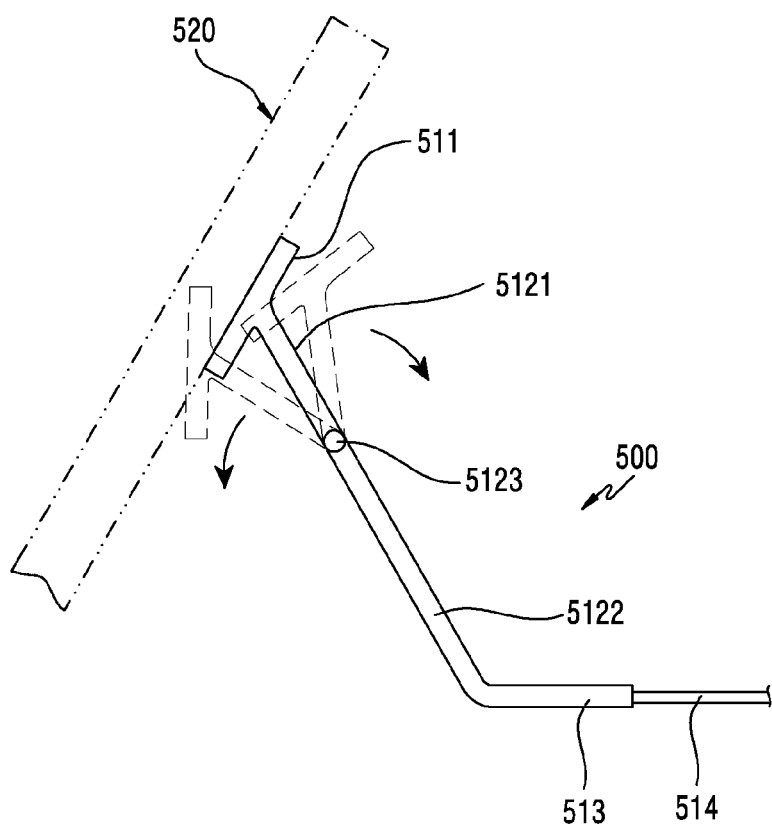
FIG. 5B is a view illustrating an operating state of the stand of FIG. 5A according to various embodiments of the disclosure.

FIG. 5A is a perspective view of a stand according to various embodiments of the disclosure. FIG. 5B is a view illustrating an operating state of the stand of FIG. 5A according to various embodiments of the disclosure.

The stand 500 of FIGS. 5A and 5B may be similar to the stand 320 of FIGS. 3A and 3B or the stand 400 of FIGS. 4A and 4B, or may include other embodiments of the stand.

Referring to FIGS. 5A and 5B, the stand 500 may include a holding portion 511 to be selectively attached to a second surface (for example, the second surface 3003 of FIG. 3B) of an electronic device (for example, the electronic device 300 of FIG. 3A), a first leg 5121 extended from the holding portion 511 by a predetermined length and at a predetermined angle, a second leg 5122 connected to the first leg 5121 by means of a hinge module 5123 to be able to change an angle, and a base 513 extended from the second leg 5122 to come into contact with a holding surface (for example, a desk surface). According to an embodiment, it is obvious that a wireless power transmission member (for example, the wireless power transmission member 420 of FIG. 4A) and one pair of magnets (for example, the one pair of magnets 431, 432 of FIG. 4A) described above are disposed inside the holding portion 511, although they are not illustrated. According to an embodiment, the stand 500 may include a cable 514 disposed to penetrate through the holding portion 511, the legs 5121, 5122, the hinge module 5123, and the base 513 to apply external power to the wireless power transmission member.

According to various embodiments, the first leg 5121 may be rotated about an X-axis as a rotation axis by a predetermined angle with reference to the second leg 5122 by the hinge module 5123. According to an embodiment, the first leg 5121 is rotated in a clockwise direction or in a counter clockwise direction with reference to the second leg 5122, such that an electronic device 520 held by the holding portion 511 can have its holding angle freely adjusted.

According to various embodiments, an exemplary embodiment of the disclosure has a configuration of adjusting the holing angle of the electronic device 520 by using the one pair of legs 5121, 5122 and the one hinge module 5123. However, this should not be considered as limiting. For example, the stand 500 may include three or more legs, and two or more hinge modules connecting the legs to be rotatable with respect to one another.

Figure 6A:
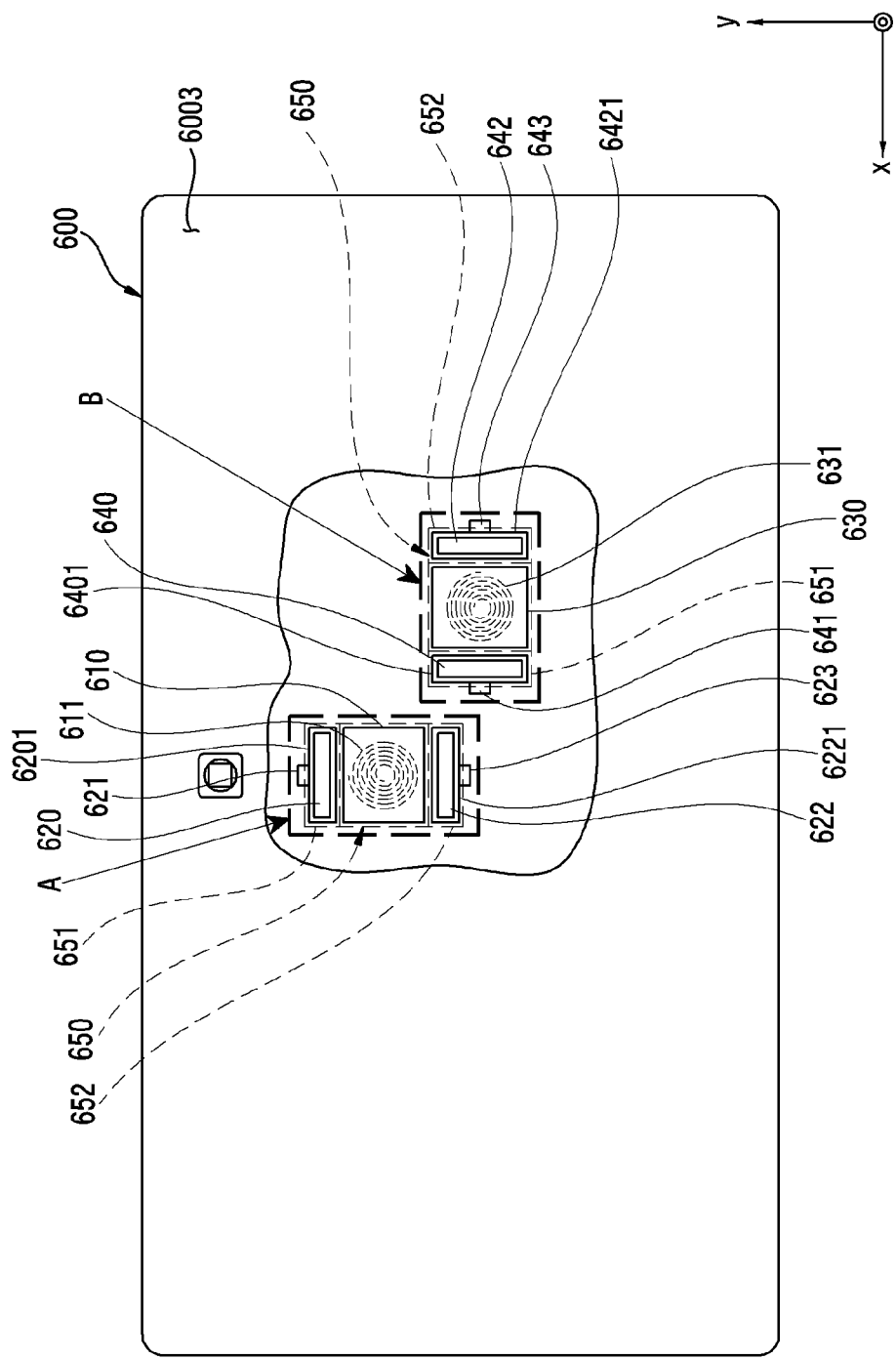
FIGS. 6A to 6C are views illustrating arrangements of a wireless power reception member and an attachment member of an electronic device according to various embodiments of the disclosure.
Figure 6B:
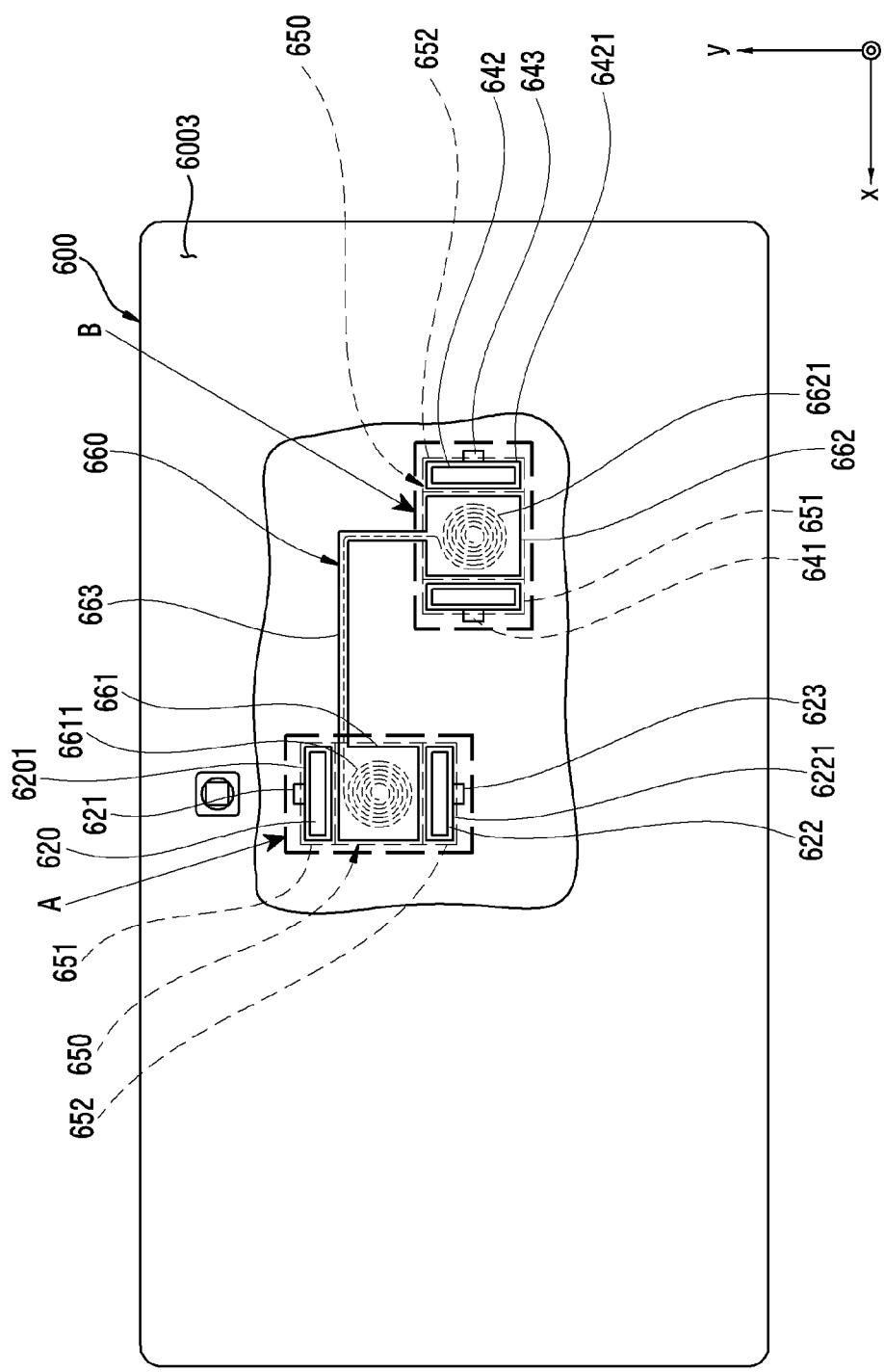
Figure 6C:
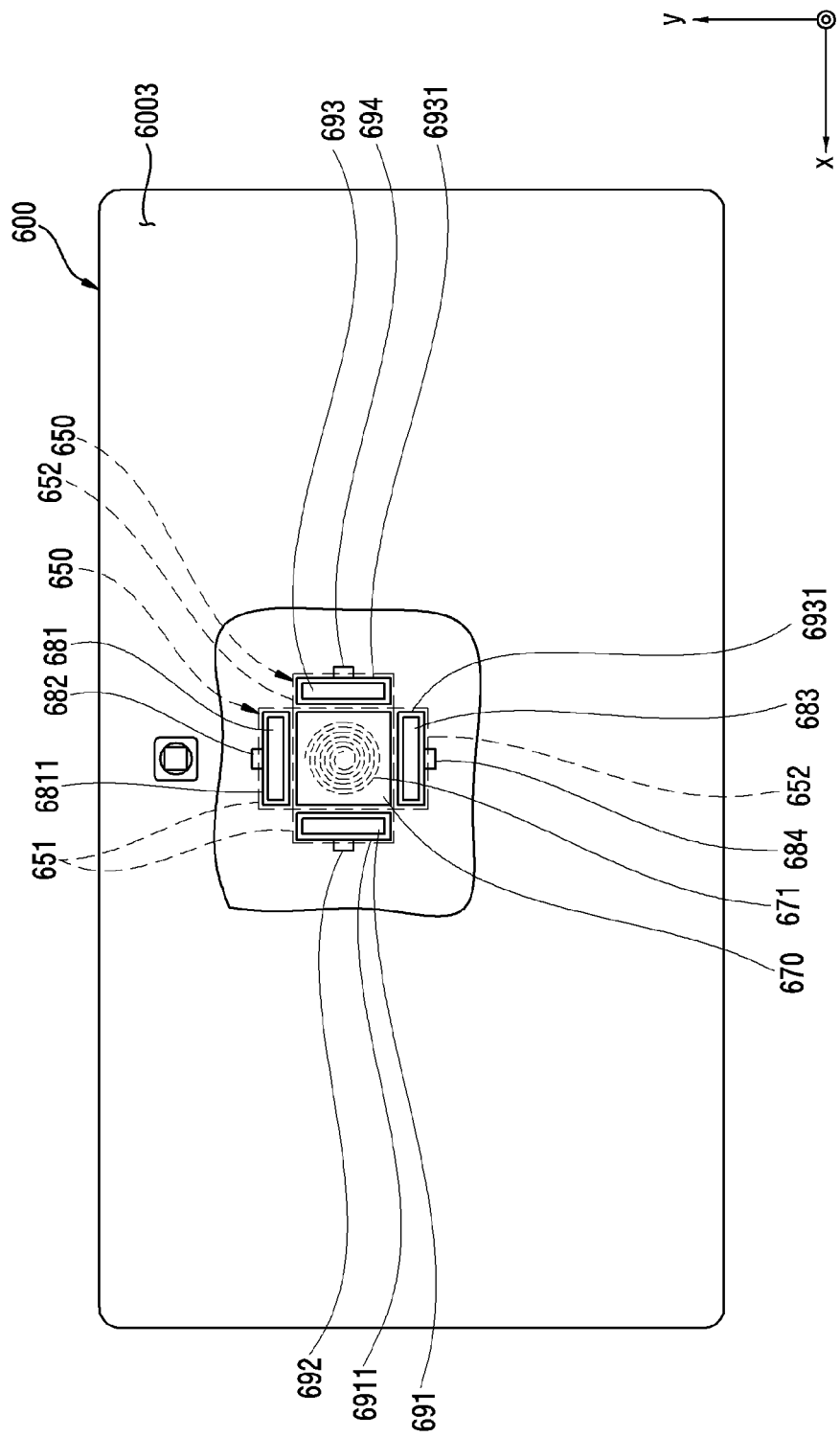

FIGS. 6A to 6C are views illustrating arrangements of a wireless power reception member and an attachment member of an electronic device according to various embodiments of the disclosure.

The electronic device 600 of FIGS. 6A to 6C may be similar to the electronic device 300 of FIG. 3A or the electronic device 520 of FIG. 5B, or may include other embodiments of the electronic device.

Referring to FIG. 6A, a part of a second surface 6003 is cut out to explain elements arranged inside the electronic device 600 as shown in the drawings, and it is noted that portions illustrated by dashed lines indicate elements of a stand (for example, the stand 320 of FIG. 3A) attached to the electronic device.

According to various embodiments, the stand 650 may be attached to a different area on the second surface 6003 of the electronic device 600 according to a holding method of the electronic device 600. For example, the illustrated area A indicates an area to which the stand 650 is attached when the electronic device 600 is held in the landscape mode (for example, a mode in which the longitudinal direction of the electronic device is parallel to the X axis), and the illustrated area B indicates an area to which the stand 650 is attached when the electronic device 600 is in the portrait mode (a mode in which the longitudinal direction of the electronic device is parallel to the Y axis).

According to various embodiments, in the area A, the electronic device 600 (for example, the electronic device of FIG. 3B) may include a first wireless power reception member 610 including a coil member 611 disposed on the second surface 6003 (for example, the second surface 3003 of FIG. 3B) in the inner space or disposed in the proximity of the second surface 6003, one pair of attachment members 620, 622 arranged on the periphery of the first wireless power reception member 610, and one pair of magnetism detection sensors 621, 623 arranged in the proximity of the attachment members, respectively. According to an embodiment, the one pair of attachment members 620, 622 may be arranged in a direction parallel to the Y axis with the first wireless power reception member 610 being disposed therebetween. According to an embodiment, the one pair of attachment members 620, 622 may include metal members or magnets that can be attracted by magnetic forces of one pair of magnets 651, 652 (for example, the one pair of magnets 431, 432 of FIG. 4A) provided in the stand 650 (for example, the stand 400 of FIG. 4A). According to an embodiment, the electronic device 600 may include the one pair of magnetism detection sensors 621, 623 arranged on the periphery of the attachment members 620, 622, respectively. According to an embodiment, the electronic device 600 may determine whether the stand 650 is mounted by detecting magnetic forces of the magnets 651, 652 of the stand 650 through the one pair of magnetism detection sensors 621, 623. According to an embodiment, the electronic device 600 may determine a holding direction of the stand 650 by detecting magnetic forces of the one pair of magnets 651, 652 arranged in the stand 650 through the one pair of magnetism detection sensors 621, 623. According to an embodiment, the electronic device 600 may include shielding members 6201, 6221 arranged to surround the attachment members 620, 622 except for a direction facing the stand 650. This is to prevent performance degradation caused by the influence on the peripheral components in the electronic device 600 when the attachment members 620, 622 are formed of magnets.

According to various embodiments, when the stand 650 is mounted on the area A of the second surface 6003, the first magnet 651 of the stand 650 may be attracted to the first attachment member 620 of the electronic device 600, and the second magnet 652 may be attracted to the second attachment member 622 of the electronic device 600. According to an embodiment, when the attachment members 620, 622 are formed of magnets, the magnets 651, 652 of the stand 650 disposed on corresponding positions may be configured to have different polarity to generate attractive forces. According to an embodiment, when the first magnet 651 and the second magnet 652 are attached to the first attachment member 620 and the second attachment member 622, respectively, the stand 650 may be securely attached to the second surface 6003 of the electronic device 600 by magnetic forces, and simultaneously, a wireless power transmission member (for example, the wireless power transmission member 420 of FIG. 4A) of the stand 650 may overlap the first wireless power reception member 610 of the electronic device 600, such that a wireless charging operation can be smoothly performed.

According to various embodiments, in the area B, the electronic device 600 (for example, the electronic device of FIG. 3B) may include a second wireless power reception member 630 including a coil member 631 disposed on the second surface 6003 (for example, the second surface 3003 of FIG. 3B) in the inner space or disposed in the proximity of the second surface 6003, and spaced apart from the first wireless power reception member 610 by a predetermined distance, one pair of attachment members 640, 642 arranged on the periphery of the first wireless power reception member 630, and one pair of magnetism detection sensors 641, 643 arranged in the proximity of the attachment members, respectively. According to an embodiment, the one pair of attachment members 640, 642 may be arranged in a direction parallel to the X axis with the second wireless power reception member 630 being disposed therebetween. According to an embodiment, the one pair of attachment members 640, 642 may include metal members or magnets that can be attracted by magnetic forces of one pair of magnets 651, 652 (for example, the one pair of magnets 431, 432 of FIG. 4A) provided in the stand 650 (for example, the stand 400 of FIG. 4A). According to an embodiment, the electronic device 600 may include the one pair of magnetism detection sensors 641, 643 arranged on the periphery of the attachment members 640, 642, respectively. According to an embodiment, the electronic device 600 may determine whether the stand 650 is mounted by detecting magnetic forces of the magnets 651, 652 of the stand 650 through the one pair of magnetism detection sensors 641, 643. According to an embodiment, the electronic device 600 may determine a holding direction of the stand 650 by detecting magnetic forces of the one pair of magnets 651, 652 arranged in the stand 650 through the one pair of magnetism detection sensors 641, 643. According to an embodiment, the electronic device 600 may include shielding members 6401, 6421 arranged to surround the attachment members 640, 642 except for a direction facing the stand 650. This is to prevent performance degradation caused by the influence on the peripheral components in the electronic device 600 when the attachment members 640, 642 are formed of magnets.

According to various embodiments, when the stand 650 is mounted on the area B of the second surface 6003, the first magnet 651 of the stand 650 may be attracted to the first attachment member 640 of the electronic device 600, and the second magnet 652 may be attracted to the second attachment member 642 of the electronic device 600. According to an embodiment, when the attachment members 640, 642 are formed of magnets, the magnets 651, 652 of the stand 650 disposed on corresponding positions may be configured to have different polarity to generate attractive forces. According to an embodiment, when the first magnet 651 and the second magnet 652 are attached to the first attachment member 640 and the second attachment member 642, respectively, the stand 650 may be securely attached to the second surface 6003 of the electronic device 600 by magnetic forces, and simultaneously, the wireless power transmission member (for example, the wireless power transmission member 420 of FIG. 4A) of the stand 650 may overlap the second wireless power reception member 630 of the electronic device 600, such that a wireless charging operation can be smoothly performed.

Referring to FIG. 6B, the electronic device may have the same configuration as that of FIG. 6A, and only a wireless power reception member 660 may be disposed to have a different configuration.

According to various embodiments, the wireless power reception member 660 may be disposed as one member. According to an embodiment, the wireless power reception member 660 may include a first member area 661 disposed on a position corresponding to the area A of FIG. 6A, and a second member area 662 disposed on a position corresponding to the area B of FIG. 6A. According to an embodiment, the first member area 661 and the second member area 662 may be connected with each other by a connection portion 663. According to an embodiment, in the wireless power reception member 660, a first coil portion 6611 disposed in the first member area 661 and a second coil portion 6621 disposed in the second member area 662 may be integrally connected with each other through the connection portion 663. Due to this configuration, the wireless power reception members which are individually applied according to a holding direction of the electronic device 600 by the stand 650 are integrated into one member, such that the number of assembly processes can be reduced and a manufacturing cost can be reduced.

FIG. 6C is a configuration view of the electronic device illustrating an arrangement relationship of a wireless power reception member and an attachment member according to various embodiments of the disclosure.

The wireless power reception member 670 of FIG. 6C may include one coil member 671, and the corresponding coil member 671 may be formed to have a size enough to cover attachment positions of the stand 650 for the landscape mode and the portrait mode of the electronic device 600. According to an embodiment, the coil member 671 may be disposed on a position to be able to cover attachment positions of the stand for the landscape mode and the portrait mode of the electronic device.

According to various embodiments, the electronic device 600 (for example, the electronic device of FIG. 3B) may include one wireless power reception member 670 including the coil member 671 disposed on the second surface 6003 (for example, the second surface 3003 of FIG. 3B) in the inner space or disposed in the proximity of the second surface 6003, four attachment members 681, 683, 691, 693 arranged on the periphery of the wireless power reception member 670, and four magnetism detection sensors 682, 684, 692, 694 arranged on the periphery of the attachment members, respectively. According to an embodiment, one pair of attachment members 681, 683 may be arranged in a direction parallel to the Y axis with the wireless power reception member 670 being disposed therebetween. According to an embodiment, the other pair of attachment members 691, 693 may be arranged in a direction parallel to the X axis with the wireless power reception member 670 being disposed therebetween.

According to various embodiments, the respective attachment members 681, 683, 691, 693 may include metal members or magnets which can be attracted by magnetic forces of one pair of magnets 651, 652 (for example, the one pair of magnets 431, 432 of FIG. 4A) provided in the stand 650 (for example, the stand 400 of FIG. 4A). According to an embodiment, the electronic device 600 may determine whether the stand 650 is mounted by selectively detecting magnetic forces of the magnets 651, 652 of the stand 650 through the respective magnetism detection sensors 682, 684, 692, 694. According to an embodiment, the electronic device 600 may determine a holding direction of the stand 650 by detecting magnetic forces of one pair of magnets 651, 652 disposed in the stand 650 through selective detection by the four magnetism detection sensors 682, 684, 692, 694. According to an embodiment, the electronic device 600 may include shielding members 6811, 6831, 6911, 6931 disposed to surround the attachment members 681, 683, 691, 693, respectively, except for a direction facing the stand 650. This is to prevent performance degradation caused by the influence on the peripheral components in the electronic device 600 when the respective attachment members 681, 683, 691, 693 are formed of magnets.

Figure 7:
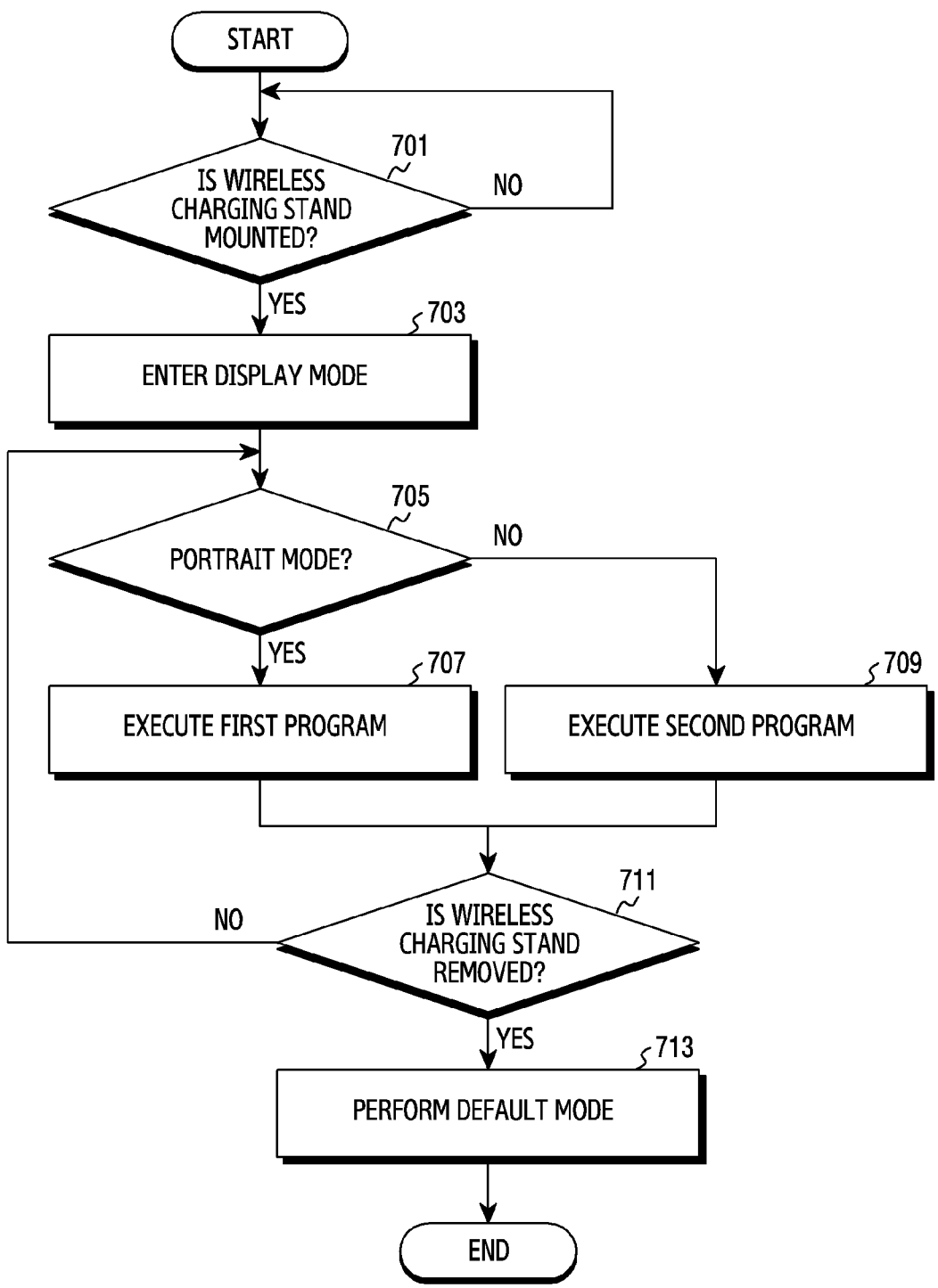
FIG. 7 is a flowchart illustrating a procedure for executing a customized program according to holding information of an electronic device held by a stand according to various embodiments of the disclosure.

FIG. 7 is a flowchart illustrating a procedure for executing a customized program according to holding information of an electronic device held by a stand according to various embodiments of the disclosure.

Referring to FIG. 7, in operation 701, the electronic device may identify whether a wireless charging stand is mounted. According to an embodiment, the electronic device (for example, the electronic device 600 of FIG. 6A) may detect a magnetic force of at least one magnet (for example, the magnets 651, 652 of FIG. 6A) provided in the stand (for example, the stand 650 of FIG. 6A) through at least one magnetism detection sensor (for example, the magnetism detection sensors 621, 623, 641, 643) disposed inside the electronic device. According to an embodiment, when the stand is attached to the electronic device, the at least one magnet provided in the stand may be attached to at least one attachment member (for example, the attachment members 620, 622, 640, 642 of FIG. 6A) disposed on a corresponding position of a second surface (for example, the second surface 6003 of FIG. 6A) of the electronic device by magnetic forces.

According to various embodiments, when the stand (for example, the stand 650 of FIG. 6A) is mounted, the electronic device (for example, the electronic device 600 of FIG. 6A) may enter a display mode in operation 703. According to an embodiment, the electronic device may detect the mounting of the stand by detecting the magnetic force of the at least one magnet (for example, the magnets 651, 652 of FIG. 6A) of the stand through the at least one magnetism detection sensor (for example, the magnetism detection sensors 621, 623, 641, 643), and may enter the corresponding display mode. According to an embodiment, the display mode may include a mode which is different from a default mode (for example, an idle mode) of the electronic device, and in which at least one predetermined program is executed. According to an embodiment, the display mode may include a mode in which at least one program for providing convenience to a user is performed according to a holding direction of the electronic device. According to an embodiment, the display mode may include an operation of outputting at least one program through a display (for example, the display 301 of FIG. 3) of the electronic device. However, this should not be considered as limiting. The display mode may include an operation of outputting at least one executed program through an auditory output means (for example, a speaker device) or a tactile output means (for example, a vibrator) disposed in the electronic device.

According to various embodiments, in operation 705, it may be identified whether the holding direction of the electronic device (for example, the electronic device 600 of FIG. 6A) mounted on the stand (for example, the stand 650 of FIG. 6A) is the landscape mode. According to an embodiment, the electronic device may identify whether the current holding direction of the electronic device is the landscape mode through a gyro sensor (for example, the gyro sensor 240B of FIG. 2) disposed inside the electronic device. However, this should not be considered as limiting. The electronic device (for example, the electronic device 600 of FIG. 6A) may identify whether the current holding direction of the electronic device is the landscape mode by selectively detecting magnetic forces of the magnet (for example, the magnets 651, 652 of FIG. 6A) disposed in the stand (for example, the stand 650 of FIG. 6A) through the at least one magnetism detection sensor (for example, the magnetism detection sensors 621, 623 of FIG. 6A) disposed inside the electronic device.

According to various embodiments, when the electronic device (for example, the electronic device 600 of FIG. 6A) is in the landscape mode, the electronic device may perform an operation of executing at least one first program in operation 707.

Figure 8A:
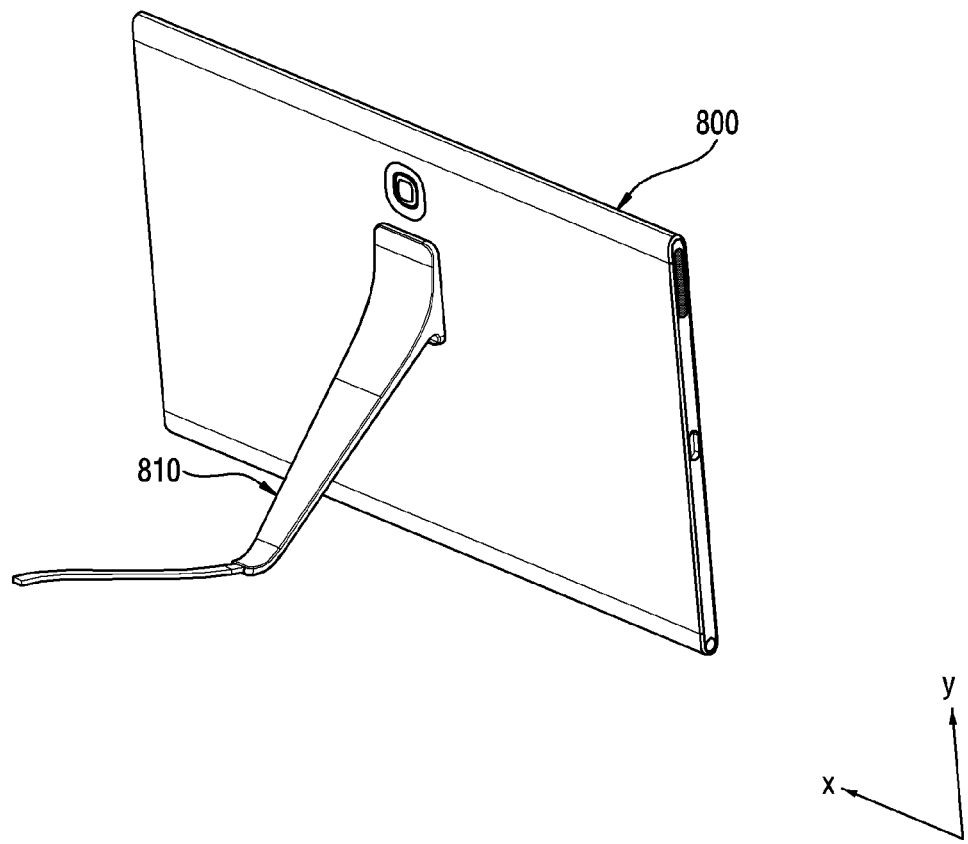
FIGS. 8A and 8B are views illustrating a state in which an electronic device is held in a horizontal direction according to various embodiments of the disclosure.
Figure 8B:
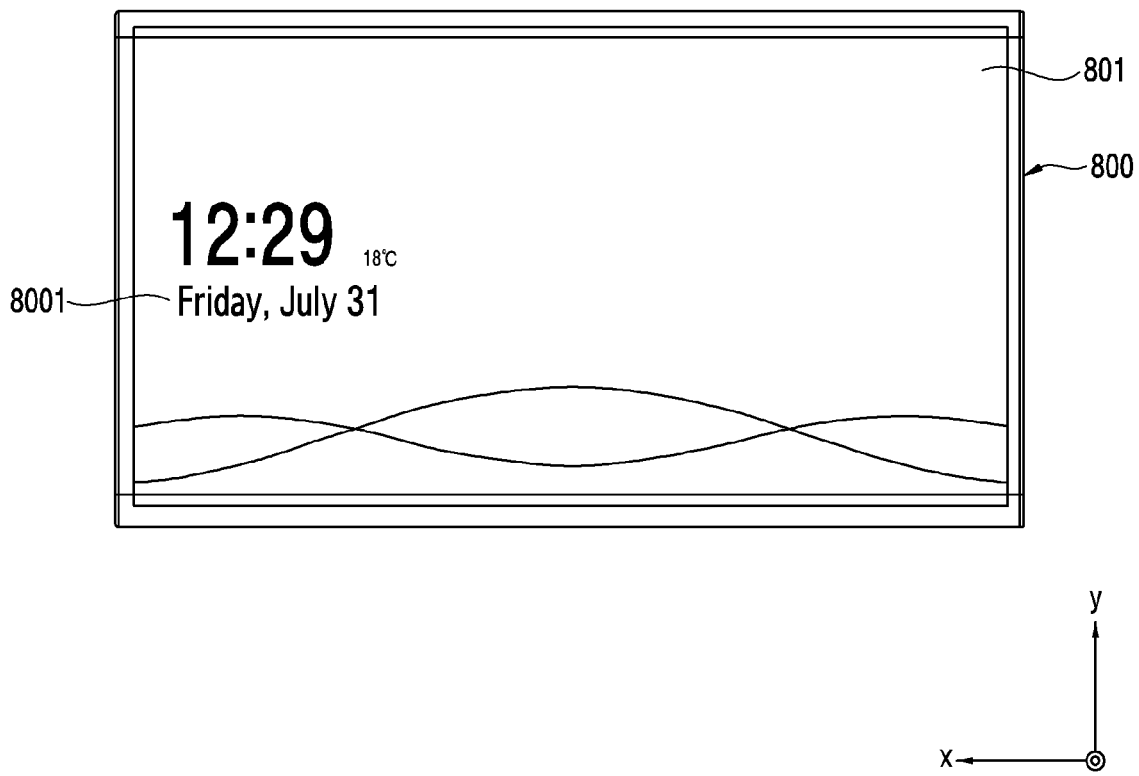

According to various embodiments. FIGS. 8A and 8B are views illustrating a state in which an electronic device 800 according to various embodiments of the disclosure is held in a horizontal direction, and, when the electronic device 800 is mounted in the horizontal direction (for example, a direction in which the longitudinal direction of the electronic device is parallel to the X axis) through a stand 810, the electronic device 800 may display at least one object 8001 corresponding to execution of the first program through a display 801. According to an embodiment, the at least one first program may include a program for executing at least one mode of a gallery mode (for example, a picture frame mode including an object related to a current date and/or time) displaying a photo stored in a memory (for example, the memory 230 of FIG. 2), a content replay mode including a video, etc., or a music output mode.

According to various embodiments, when the electronic device (for example, the electronic device 600 of FIG. 6A) is not in the landscape mode in operation 705, the electronic device may recognize the portrait mode and enter operation 709 to perform an operation of executing at least one second program.

Figure 9A:
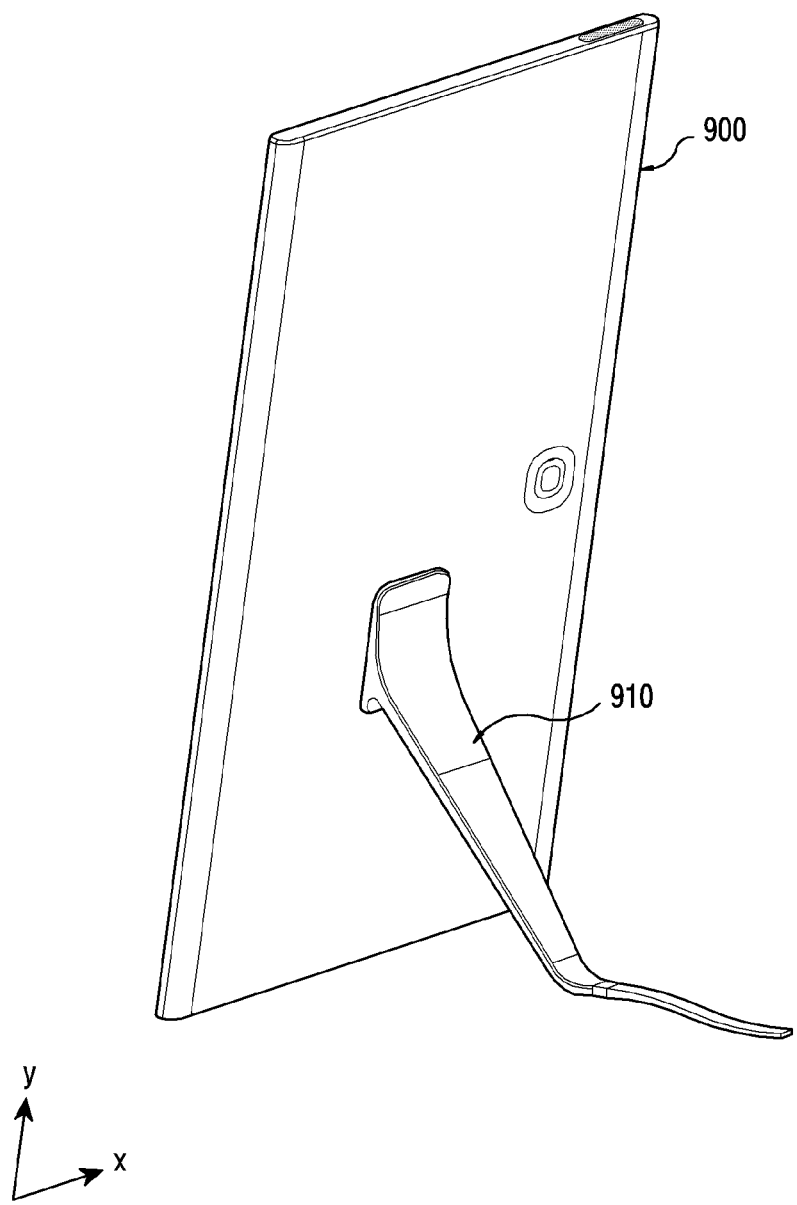
FIGS. 9A and 9B are views illustrating a state in which an electronic device is held in a vertical direction according to various embodiments of the disclosure.
Figure 9B:
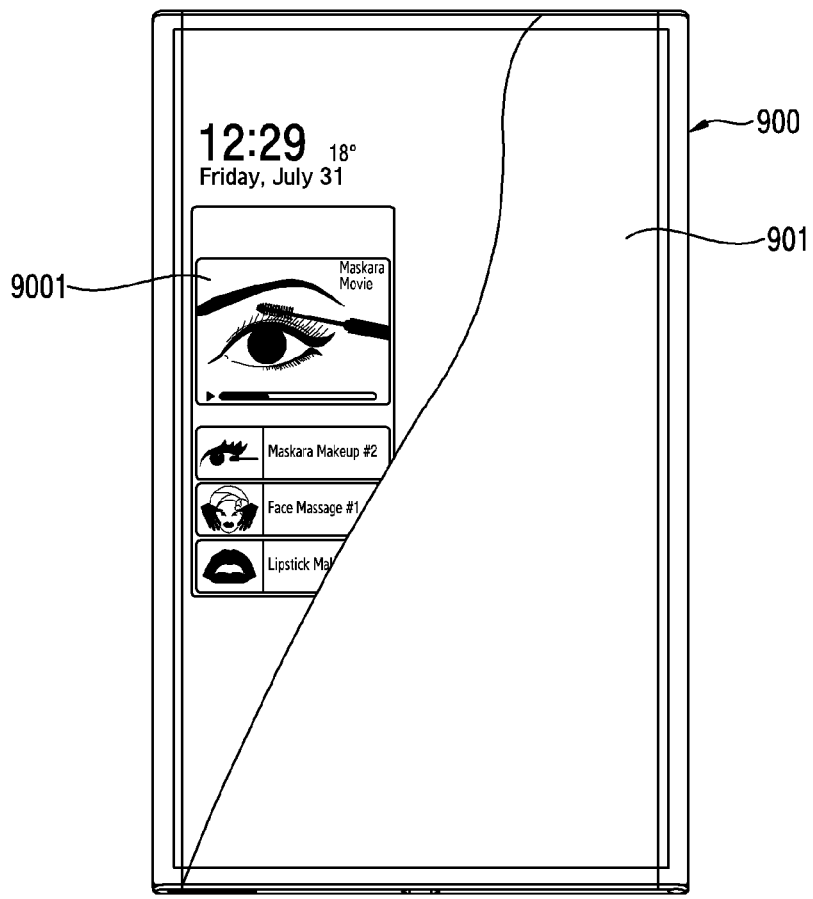

According to various embodiments. FIGS. 9A and 9B are views illustrating a state in which an electronic device 900 according to various embodiments of the disclosure is held in a vertical direction, and, when the electronic device 900 is mounted through the stand 910 in the vertical direction (for example, a direction in which the longitudinal direction of the electronic device is parallel to the Y axis), the electronic device 900 may display at least one object 9001 corresponding to execution of the second program through a display 901. According to an embodiment, the at least one second program may include a program for executing at least one mode of a scheduler mode, a calendar mode, or a mirror mode corresponding to the portrait mode of the electronic device 900.

According to various embodiments, the first program and the second program may be set to execute a program customized by a user of the electronic device. According to an embodiment, the first program and the second program may include at least one program which is customized by a manufacturer of the electronic device according to a type of a holding mode pre-stored in the memory (for example, the memory 230 of FIG. 2) of the electronic device.

According to various embodiments, in operation 711, it may be identified whether the wireless charging stand (for example, the stand 650 of FIG. 6A) is removed from the electronic device (for example, the electronic device 600 of FIG. 6A). According to an embodiment, the electronic device (for example, the electronic device 600 of FIG. 6A) may identify whether the magnetic force of the at least one magnet (for example, the magnets 651, 652 of FIG. 6A) of the stand, which is detected through the at least one magnetism detection sensor (for example, the magnetism detection sensors 621, 623, 641, 643 of FIG. 6A) disposed inside the electronic device (for example, the electronic device 600 of FIG. 6A), is removed. In this case, the electronic device (for example, the electronic device 600 of FIG. 6A) may enter operation 713 to switch to the default mode (for example, an idle mode) of the electronic device.

According to various embodiments, a stand for holding an electronic device may include: a stand housing; a wireless power transmission member disposed in an inner space of the stand housing; and at least one magnet disposed in the proximity of the wireless power transmission member, and the stand may be attached to an outer surface of the electronic device in such a way that at least one attachment member disposed in an inner space of the electronic device is attached by a magnetic force of the magnet, and may provide wireless power to the electronic device through the wireless power transmission member.

According to various embodiments, the wireless power transmission member may be disposed in an area of the stand that corresponds to a wireless power reception member disposed in the inner space of the electronic device.

According to various embodiments, the stand housing may include: a holding portion including a seating portion in which the magnet and the wireless power transmission member are disposed; at least one leg extended from the holding portion to have a predetermined length and a predetermined angle; a base bent and extended from an end of the leg by a predetermined angle to be placed on a holding surface; and a cover coupled to the holding portion to regulate the magnet and the wireless power transmission member.

According to various embodiments, the at least one leg may include: a first leg extended from the holding portion; a second leg extended from the base; and a hinge module coupling the first leg to be rotated about the second leg by a predetermined angle, and the first leg may be rotated about the second leg such that a holding angle of the electronic device is adjusted.

According to various embodiments, an electronic device may include: a housing including a first surface facing in a first direction, a second surface facing in a second direction opposite to the first direction, and a side surface formed along edges of the first surface and the second surface to provide an inner space; a display exposed on a least a part of the first surface; a first attachment member disposed in a first area in the inner space in the second direction, and formed with a material that is attracted by a magnetic force of a magnet included in a stand attached to an outer surface of the electronic device corresponding to the first area; a second attachment member disposed in a second area in the inner space in the second direction, and formed with a material that is attracted by the magnetic force of the magnet included in the stand attached to an outer surface of the electronic device corresponding to the second area; and at least one wireless power reception member disposed in the inner space, and configured to receive wireless power from a wireless power transmission member of the stand which is selectively attached to an outer surface of the electronic device corresponding to the first area or the second area.

According to various embodiments, the first attachment member and the second attachment member may include a metal member that is attracted by the magnetic force of the magnet, or a magnet which has different polarity to generate an attractive force with the magnet.

According to various embodiments, the electronic device may include a shielding member disposed to surround at least a part of the first attachment member and the second attachment to shield at least in the first direction.

According to various embodiments, the electronic device may include: at least one first detection member disposed in the first area to detect the magnetic force of the magnet included in the stand; at least one second detection member disposed in the second area to detect the magnetic force of the magnet included in the stand; and at least one processor configured to determine whether the stand is mounted or a holding direction of the electronic device by detecting the magnetic force of the magnet by using the at least one first detection member or the at least one second detection member.

According to various embodiments, the first detection member and the second detection member may include a hall sensor configured to detect the magnet included in the stand.

According to various embodiments, the electronic device may include a gyro sensor configured to detect a holding direction of the electronic device held by the stand.

According to various embodiments, the at least one wireless power reception member may include a first wireless power reception member disposed in the first area and a second wireless power reception member disposed in the second area.

According to various embodiments, the at least one wireless power reception member may be disposed to include both the first area and the second area.

According to various embodiments, there is provided a holding system including an electronic device, and a stand coming into contact with at least a part of the electronic device to hold the electronic device.

The electronic device may include: a first attachment member disposed in a first area in an inner space of the electronic device, and formed with a material that is attracted by a magnetic force of a magnet included in the stand which is attached to an outer surface of the electronic device corresponding to the first area; a second attachment member disposed in a second area in the inner space of the electronic device, and formed with a material that is attracted by the magnetic force of the magnet included in the stand which is attached to an outer surface of the electronic device corresponding to the second area; and at least one wireless power reception member disposed in the inner space of the electronic device to receive wireless power from the stand.

The stand may include: a wireless power transmission member disposed in an inner space of the stand to provide wireless power to the wireless power reception member; and at least one magnet disposed in the inner space of the stand to provide a magnetic force to be coupled to the first attachment member or the second attachment member, and, when the stand is attached to an outer surface of the electronic device by the magnetic force of the magnet, wireless charging may be performed in the electronic device from the stand.

According to various embodiments, the electronic device may include: at least one first detection member disposed in the first area to detect the magnetic force of the magnet included in the stand; at least one second detection member disposed in the second area to detect the magnetic force of the magnet included in the stand; and at least one processor configured to determine whether the stand is mounted or a holding direction of the electronic device by detecting the magnetic force of the magnet by using the at least one first detection member or the at least one second detection member.

According to various embodiments, the electronic device may include a gyro sensor configured to detect a holding direction of the electronic device held by the stand.

According to various embodiments, an operating method of an electronic device may include: determining whether a stand is mounted by detecting a magnetic force of at least one magnet included in the stand; when the stand is mounted, identifying whether the electronic device is held in a landscape mode; and, when the electronic device is in the landscape mode, executing at least one first program.

According to various embodiments, the method may further include, when the electronic device is not in the landscape mode, determining whether the electronic device is in a portrait mode in which the electronic device is held in a direction perpendicular to the portrait mode, and, when the electronic device is in the portrait mode, executing at least one second program.

According to various embodiments, the method may further include setting a first program and a second program, and storing the set first program and second program in a memory.

According to various embodiments, the first program and the second program may include a program for executing at least one mode of a gallery mode, a content replay mode, a music output mode, a scheduler mode, a calendar mode, or a mirror mode.

According to various embodiments, the method may further include outputting the executed first program or second program through a display.

According to various embodiments, a stand for holding an electronic device may include: an attachment portion including a magnet to be attached to at least a part of the electronic device by a magnetic force, and a wireless power transmission member for providing wireless power to the electronic device; a support extended from the attachment portion to support the electronic device attached to the attachment portion; a bottom support extended from an end of the support to come into contact with a holding surface; and a cable electrically connected with the wireless power transmission member through the bottom support, the support, and the attachment portion to provide external power.

In addition, the embodiments disclosed in the disclosure and the drawings are suggested for easy explanation of the technical features according to embodiments of the disclosure and better understanding of the embodiments of the disclosure, and are not intended to limit the scope of the embodiments of disclosure. Therefore, the scope of various embodiments of the disclosure should be interpreted as including all changes or modified forms derived based on the technical idea of the disclosure, in addition to the embodiments disclosed herein.

The invention claimed is:

1. A stand for holding an electronic device, the stand comprising:
   a stand housing;
   a wireless power transmission member disposed in an inner space of the stand housing;
   at least one magnet disposed in proximity of the wireless power transmission member;
   a cover; and
   a cable,
   wherein the stand is attached to an outer surface of the electronic device in such a way that at least one attachment member disposed in an inner space of the electronic device is attached by a magnetic force of the magnet, and is configured to provide wireless power to the electronic device through the wireless power transmission member,
   wherein the stand housing comprises:
      a holding portion coupled to the cover on a first side of the holding portion and comprising a seating portion in which the magnet and the wireless power transmission member are disposed;
      at least one leg extended from a second side of the holding portion to have a predetermined length and a predetermined angle, wherein the second side disposed opposite to the first side; and
      a base bent and extended from an end of the leg by a predetermined angle to be placed on a holding surface, and
   wherein the cover is coupled to the holding portion to enclose the wireless power transmission member and the at least one magnet, and
   wherein the cable is connected to the wireless power transmission member and disposed to penetrate through at least one of the holding portion, the at least one leg, or the base.

2. The stand of claim 1, wherein the wireless power transmission member is disposed in an area of the stand that corresponds to a wireless power reception member disposed in the inner space of the electronic device.

3. The stand of claim 1, wherein the at least one leg comprises:
   a first leg extended from the holding portion;
   a second leg extended from the base; and
   a hinge module coupling the first leg to be rotated about the second leg by a predetermined angle,
   wherein the first leg is rotated about the second leg such that a holding angle of the electronic device is adjusted.

4. An electronic device comprising:
   a housing comprising a first surface facing in a first direction, a second surface facing in a second direction opposite to the first direction, and a side surface formed along edges of the first surface and the second surface to provide an inner space;
   a display exposed on a least a part of the first surface;
   a first attachment member disposed in a first area in the inner space in the second direction, and formed with a material that is attracted by a magnetic force of a magnet included in a stand attached to an outer surface of the electronic device corresponding to the first area;
   a second attachment member disposed in a second area in the inner space in the second direction, and formed with a material that is attracted by the magnetic force of the magnet included in the stand attached to an outer surface of the electronic device corresponding to the second area;
   at least one wireless power reception member disposed in the inner space, and configured to receive wireless power from a wireless power transmission member of the stand which is selectively attached to an outer surface of the electronic device corresponding to the first area or the second area; and
   at least one processor,
   wherein the at least one processor is configured to:
      when the electronic device is mounted on the stand, identify a holding direction of the electronic device,
      when the identified holding direction is the first direction, display at least one first object corresponding to execution of at least one first program, and
      when the identified holding direction is the second direction, display at least one second object corresponding to execution of at least one second program.

5. The electronic device of claim 4, wherein the first attachment member and the second attachment member comprise a metal member that is attracted by the magnetic force of the magnet, or a second magnet which has different polarity to generate an attractive force with the magnet.

6. The electronic device of claim 4, wherein the electronic device comprises a shielding member disposed to surround at least a part of the first attachment member and the second attachment member to shield at least in the first direction.

7. The electronic device of claim 4, comprising:
   at least one first detection member disposed in the first area to detect the magnetic force of the magnet included in the stand; and
   at least one second detection member disposed in the second area to detect the magnetic force of the magnet included in the stand,
   wherein the at least one processor is further configured to determine whether the stand is mounted or the holding direction of the electronic device by detecting the magnetic force of the magnet by using the at least one first detection member or the at least one second detection member.

8. The electronic device of claim 7, wherein the first detection member and the second detection member comprise a hall sensor configured to detect the magnet included in the stand.

9. The electronic device of claim 7, wherein the electronic device comprises a gyro sensor configured to detect the holding direction of the electronic device held by the stand.

10. The electronic device of claim 4, wherein the at least one wireless power reception member comprises a first wireless power reception member disposed in the first area and a second wireless power reception member disposed in the second area.

11. The electronic device of claim 4, wherein the at least one wireless power reception member is disposed to comprise both the first area and the second area.

12. A holding system comprising:
an electronic device;
a stand coming into contact with at least a part of the electronic device to hold the electronic device,
wherein the electronic device comprises:
- a first attachment member disposed in a first area in an inner space of the electronic device, and formed with a material that is attracted by a magnetic force of a magnet included in the stand which is attached to an outer surface of the electronic device corresponding to the first area;
- a second attachment member disposed in a second area in the inner space of the electronic device, and formed with a material that is attracted by the magnetic force of the magnet included in the stand which is attached to an outer surface of the electronic device corresponding to the second area;
- at least one wireless power reception member disposed in the inner space of the electronic device to receive wireless power from the stand; and
at least one processor,
wherein the at least one processor is configured to:
when the electronic device is mounted on the stand, identify a holding direction of the electronic device,
when the identified holding direction is a first direction, display at least one first object corresponding to execution of at least one first program, and
when the identified holding direction is a second direction, display at least one second object corresponding to execution of at least one second program,
wherein the stand comprises:
- a stand housing;
- a cover;
- a cable;
- a wireless power transmission member disposed in an inner space of the stand to provide the wireless power to the wireless power reception member; and
- at least one magnet disposed in the inner space of the stand to provide the magnetic force to be coupled to the first attachment member or the second attachment member,
wherein, when the stand is attached to an outer surface of the electronic device by the magnetic force of the magnet, wireless charging is performed in the electronic device from the stand,
wherein the stand housing comprises:
- a holding portion coupled to the cover on a first side of the holding portion and comprising a seating portion in which the magnet and the wireless power transmission member are disposed;
- at least one leg extended from a second side of the holding portion to have a predetermined length and a predetermined angle, wherein the second side disposed opposite to the first side;
- a base bent and extended from an end of the leg by a predetermined angle to be placed on a holding surface; and
wherein the cover is coupled to the holding portion to enclose the wireless power transmission member and the at least one magnet, and
wherein the cable is connected to the wireless power transmission member and disposed to penetrate through at least one of the holding portion, the at least one leg, or the base.

13. The holding system of claim 12, wherein the electronic device comprises:
at least one first detection member disposed in the first area to detect the magnetic force of the magnet included in the stand; and
at least one second detection member disposed in the second area to detect the magnetic force of the magnet included in the stand,
wherein the at least one processor is further configured to determine whether the stand is mounted or the holding direction of the electronic device by detecting the magnetic force of the magnet by using the at least one first detection member or the at least one second detection member.

14. The holding system of claim 12, wherein the electronic device comprises a gyro sensor configured to detect the holding direction of the electronic device held by the stand.

15. The holding system of claim 12, wherein the at least one leg comprises:
a first leg extended from the holding portion;
a second leg extended from the base; and
a hinge module coupling the first leg to be rotated about the second leg by a predetermined angle,
wherein the first leg is rotated about the second leg such that a holding angle of the electronic device is adjusted.

16. The holding system of claim 12, wherein the electronic device further comprises a shielding member disposed to surround at least a part of the first attachment member and the second attachment member.

17. The holding system of claim 13, wherein the first detection member and the second detection member comprise a hall sensor configured to detect the magnet included in the stand.

18. The holding system of claim 12, wherein the at least one wireless power reception member comprises a first wireless power reception member disposed in the first area and a second wireless power reception member disposed in the second area.

* * * * *